(12) United States Patent
Perkins

(10) Patent No.: US 7,750,518 B1
(45) Date of Patent: Jul. 6, 2010

(54) TRANSIENT ENERGY SYSTEMS AND METHODS FOR USE OF THE SAME

(75) Inventor: David E. Perkins, Austin, TX (US)

(73) Assignee: Active Power, Inc., Austin, TX (US)

( * ) Notice: Subject to any disclaimer, the term of this patent is extended or adjusted under 35 U.S.C. 154(b) by 655 days.

(21) Appl. No.: 11/606,848

(22) Filed: Nov. 29, 2006

(51) Int. Cl.
*H02K 5/16* (2006.01)
*H02K 7/08* (2006.01)

(52) U.S. Cl. .............................. 310/90; 384/518; 310/89

(58) Field of Classification Search .................. 310/89, 310/90, 51; 384/518, 535, 536, 563, 581, 384/582
See application file for complete search history.

(56) References Cited

U.S. PATENT DOCUMENTS

| | | | |
|---|---|---|---|
| 3,675,099 A | | 7/1972 | Johnston |
| 3,816,782 A | * | 6/1974 | Dow et al. ..................... 310/90 |
| 4,048,528 A | | 9/1977 | Whitney |
| 4,100,745 A | | 7/1978 | Gyarmathy et al. |
| 4,110,987 A | | 9/1978 | Cahn et al. |
| 4,147,204 A | | 4/1979 | Pfenninger |
| 4,150,547 A | | 4/1979 | Hobson |
| 4,158,145 A | | 6/1979 | Kartsounes et al. |
| 4,228,360 A | | 10/1980 | Navarro |
| 4,237,692 A | | 12/1980 | Ahrens et al. |
| 4,281,256 A | | 7/1981 | Ahrens et al. |
| 4,495,451 A | | 1/1985 | Barnard |
| 4,593,202 A | | 6/1986 | Dickinson |
| 4,699,528 A | * | 10/1987 | Gotman ..................... 384/536 |
| 4,765,142 A | | 8/1988 | Nakhamkin |
| 4,872,307 A | | 10/1989 | Nakhamkin |
| 4,896,239 A | * | 1/1990 | Ghose ........................ 360/267 |
| 4,936,098 A | | 6/1990 | Nakhamkin |

(Continued)

FOREIGN PATENT DOCUMENTS

EP   0 563 553   2/1993

(Continued)

OTHER PUBLICATIONS

U.S. Appl. No. 11/606,434, filed Nov. 29, 2006, Perkins et al.

(Continued)

*Primary Examiner*—Quyen Leung
*Assistant Examiner*—Leda Pham
(74) *Attorney, Agent, or Firm*—Hulsey, P.C.

(57) ABSTRACT

This disclosure relates to transient energy systems for supplying power to a load substantially instantaneously on demand. Transient energy systems may include a flywheel coupled the rotor of an induction motor generator. One embodiment of the disclosure refers to systems and methods for reducing loads on a bearing in a transient energy system. In another embodiment, the disclosure refers to an induction motor generator that is optimized for high power transient power generation, yet low power motor operation. Yet another embodiment of the disclosure refers to using a flywheel as a drag pump to cool components of a transient energy system. In yet another embodiment, a slip control scheme is discussed for regulating a DC bus. In yet a further embodiment of the disclosure a method is provided for reducing unnecessary turbine starts by making turbine start a function of the rotational velocity of a flywheel.

10 Claims, 21 Drawing Sheets

U.S. PATENT DOCUMENTS

| | | | |
|---|---|---|---|
| 5,379,589 A | 1/1995 | Cohn et al. | |
| 5,491,969 A | 2/1996 | Cohn et al. | |
| 5,537,822 A | 7/1996 | Shnaid et al. | |
| 5,602,462 A | 2/1997 | Stich et al. | |
| 5,684,348 A | 11/1997 | Main | |
| 5,845,479 A | 12/1998 | Nakhamkin et al. | |
| 5,889,659 A | 3/1999 | Emmerich | |
| 5,934,063 A | 8/1999 | Nakhamkin | |
| 5,998,899 A * | 12/1999 | Rosen et al. | 310/90.5 |
| 6,108,206 A | 8/2000 | Criniti et al. | |
| 6,169,390 B1 | 1/2001 | Jungreis | |
| 6,192,687 B1 | 2/2001 | Pinkerton et al. | |
| 6,255,743 B1 | 7/2001 | Pinkerton et al. | |
| 6,321,539 B1 | 11/2001 | Bronicki et al. | |
| 6,388,347 B1 | 5/2002 | Blake et al. | |
| 6,463,738 B1 | 10/2002 | Pinkerton et al. | |
| 6,486,627 B1 | 11/2002 | Gabrys | |
| 6,494,042 B2 | 12/2002 | Bronicki | |
| 6,512,305 B1 | 1/2003 | Pinkerton et al. | |
| 6,727,616 B1 * | 4/2004 | Gabrys et al. | 310/90.5 |
| 6,819,012 B1 | 11/2004 | Gabrys | |
| 6,844,706 B2 | 1/2005 | Pinkerton, III et al. | |
| 6,883,328 B2 | 4/2005 | Bronicki | |
| 7,068,014 B2 | 6/2006 | Gabrys | |
| 7,071,581 B2 | 7/2006 | Eisenhaure et al. | |
| 7,125,172 B2 * | 10/2006 | Ostling et al. | 384/537 |
| 7,129,593 B2 | 10/2006 | King et al. | |
| 7,230,344 B2 | 6/2007 | Pollack et al. | |
| 7,358,620 B2 | 4/2008 | Melfi | |
| 2001/0000091 A1 | 4/2001 | Nakhamkin et al. | |
| 2002/0014802 A1 | 2/2002 | Cratty | |
| 2006/0181168 A1 * | 8/2006 | Hargraves et al. | 310/90 |

FOREIGN PATENT DOCUMENTS

| | | |
|---|---|---|
| FR | 2 807 884 | 10/2001 |
| WO | WO 96/19942 | 1/1996 |
| WO | WO 99/15319 | 4/1999 |
| WO | WO 02/44555 A1 | 6/2002 |
| WO | WO 2004/053295 A1 | 6/2004 |
| WO | WO 2005/006516 A1 | 1/2005 |

OTHER PUBLICATIONS

U.S. Appl. No. 11/606,435, filed Nov. 29, 2006, Andrews.
U.S. Appl. No. 11/606,843, filed Nov. 29, 2006, Schuetze et al.
U.S. Appl. No. 11/606,849, filed Nov. 29, 2006, Andrews et al.
U.S. Appl. No. 11/606,867, filed Nov. 29, 2006, Badger.
Foy, R.J., "Self Contained Power Supply on the Radio-Based ECP Braking System," GE Transportation Systems: Global Signaling, Sep. 2001.

* cited by examiner

TRANSIENT ENERGY SYSTEMS AND METHODS FOR USE OF THE SAME

BACKGROUND OF THE DISCLOSURE

This relates to transient energy systems for supplying power to a load substantially instantaneously on demand. More particularly, this relates to flywheel energy storage systems constructed with an induction motor-generator.

There are many different types of transient systems, including, for example, batteries, ultra-capacitors, and flywheel energy storage systems, all of which are capable of providing power substantially immediately on demand. Batteries have poor reliability, are bulky (thus requiring substantial storage space), are expensive to maintain, and contain environmentally damaging chemicals. Ultra-capacitors are expensive and their development has yet to achieve economies of scale which would permit their widespread use. An example of a flywheel energy storage system includes the relatively high mass flywheel type of system. In this type of flywheel energy system, the flywheel is contained in an airtight container under vacuum to reduce drag on the flywheel's rotation. A disadvantage of such flywheel systems is that they become relatively large (thereby occupying substantial floor space), heavy and costly, in applications where longer runtimes are desired.

Transient systems may be used in combination with a "long-term" backup power generation system (which systems may not be capable of supplying power substantially immediately on demand) to form an uninterruptible power supply (UPS) system. A UPS system may be operative to ensure that there is no interruption in the supply of power to a critical load in the event of an interruption in the supply of power from the primary power source (e.g., a utility power failure). A critical load may be a load requiring a continuous uninterrupted supply of power such as, for example, telecommunications systems, data centers, and other power sensitive loads. The transient energy storage system may bridge the supply of power substantially immediately after interruption in the supply of power from a primary power source (e.g., utility power) at least until a "long-term" backup power generation system (e.g., a compressed air storage system) is "activated" and able to supply power to the critical load.

Because interruptions in the supply of power from a primary power source are relatively rare, the need for transient systems to supply power on demand may occur only a few times during the life of such systems. However, when backup power is needed, the demands on the transient systems are high. The following considerations may be taken into account for transient system, and in particular, flywheel energy storage systems:

(1) the operational life of the flywheel system;
(2) the power consumed during a standby mode of operation (or motoring mode of operation);
(3) the quantity of power generated during a generation mode of operation;
(4) the response time in which real power is generated;
(5) the heat losses generated during standby mode;
(6) the ability to cool components during standby and/or generation modes;
(7) the wear and tear on components such as bearings;
(8) the audible noise;
(9) the range of voltage on a DC bus;
(10) the flywheel rotational speed;
(11) the stresses on the flywheel;
(12) the ability to control real power generated by the flywheel system;
(13) the control circuitry current limits; and
(14) the magnetic saturation limits.

There are several known configurations of flywheel energy storage systems (see, for example, U.S. Pat. No. 5,731,645). These systems maximum energy storage and require vacuum sealed enclosures to minimize flywheel windage losses. Some of the components within these systems can be highly customized and require manufacturing methods that are not widely used in industry thereby increasing cost.

Another type of system may be used to generate power, but is not conducive to transient power generation, includes conventional induction motor/generators that are driven by a prime mover (e.g., engine, wind, water, etc.) to generate power. Such induction motor/generators are designed and used for continuous duty operation. As such, the induction motor/generator is constructed to handle thermal and electrical limits for its power rating, resulting in larger sizing (and associated higher cost) and limited ability to rapidly transition from a motor mode to generator mode.

What is needed is an improved flywheel energy storage system constructed with a low-cost induction motor/generator that is optimized for transient power generation and methods for use of the same.

SUMMARY OF THE INVENTION

A flywheel energy storage system in accordance with the principles of the present invention constructed with an induction motor/generator (IMG) optimized for transient power generation is provided. The flywheel energy storage systems according to the invention may be a vertically aligned system that includes an induction motor/generator portion and a flywheel portion. The motor/generator portion may include stator circuitry, which may be mounted in a non-rotational position on the frame of the motor/generator, and rotor circuitry, which may be mounted onto a rotor assembly that rotates about a vertical axis. The rotor assembly may be mounted between top and bottom bearing housing assemblies.

The flywheel energy storage system according to the invention may be used in combination with a "long-term" backup power generation system such as, for example, a thermal and compressed air storage (TACAS) system for providing uninterrupted power to a critical load. In another example, the flywheel energy storage system may be used in combination with a compressed air storage (CAS) backup power generation system. TACAS and CAS systems generate power when the compressed gas is expanded to drive a turbine, which drives a generator to produce power.

In an embodiment of the invention, a coil spring may be built into the bottom bearing housing assembly to apply an upward preload force to the bearing contained therein. This upward force counteracts a predetermined portion of the downward force exerted by the flywheel and any other component of the rotor assembly which may contribute to the downward force exerted on the bearing. As a result of the upward preload force, the loading on the lower bearing is reduced, thereby increasing the life of the bearing. If desired, the upward preload force may be such that the load seen by both the upper and lower bearings is approximately equal.

In another embodiment for reducing bearing loading, the magnetic center of the rotor circuitry is offset in a vertical direction with respect to the magnetic center of the stator circuitry to generate an axial force (in either an upward or downward direction depending on the direction of the vertical offset) when the induction motor/generator is operating in a motoring mode. This axial force may reduce the load seen by, for example, the lower bearing, thereby increasing its operational life.

The flywheel energy storage system is optimized for transient power generation by reducing the physical size, standby power consumption, and inductance of the induction motor/generator, as compared to other induction motor/generators of comparable size. Smaller size generally correlates to less cost. Reduced standby power consumption saves energy cost and heat losses and reduced inductance enables the flywheel system to quickly switch from a motoring mode to a generating mode.

An advantage of the flywheel energy storage system according to the invention is that it is used for transient operation, and therefore the motor/generator of such a system may be optimized for transient power generation without being limited by the constraints that affect continuous duty motor/generators or motor/generators operating in a vacuum. That is, the IMG of the present invention may be designed to operate at thermal and electrical limits that may cause a conventional continuous duty motor/generator of the same size to fail. Such thermal and electrical levels may be achieved because the high power generation period is transient and the IMG is constructed to achieve the desired performance characteristics.

In another embodiment invention, components of the flywheel system may be cooled using the flywheel as a single-disc Tesla pump to pull cool ambient air into the flywheel system. The ambient air may travel over the bearings, IMG rotor and stator circuitry, and other heat generating components and be expelled from exhaust ports located near the periphery of the flywheel. Shrouding or baffling may be provided to reduce the noise created by the air flow out of the flywheel through the exhaust ports.

In another embodiment of the invention, a method is provided for determining the voltage applied to the induction motor/generator using feedback signals (e.g., DC bus voltage, motor speed, power, etc.). This method enables quick adjustments to the excitation voltage without a circuit model or calculation of any current or voltage transforms by making instantaneous phase angle adjustments to the excitation voltage in addition to slip frequency adjustments.

In an embodiment in which the flywheel system is operating in combination with a CAS or TACAS backup energy system, systems and methods are provided for starting the turbine only when the flywheel slows down to a predetermined rotational velocity (RPM). This is in contrast to known systems and methods that use a predetermined voltage (on the DC bus) or predetermined lapse of time after a primary power interruption event to trigger a turbine start event.

BRIEF DESCRIPTION OF THE DRAWINGS

The above and other features of the present invention, its nature and various advantages will be more apparent upon consideration of the following detailed description, taken in conjunction with the accompanying drawings, in which like reference characters refer to like parts throughout, and in which.

DETAILED DESCRIPTION OF THE DISCLOSURE

Figure 1:
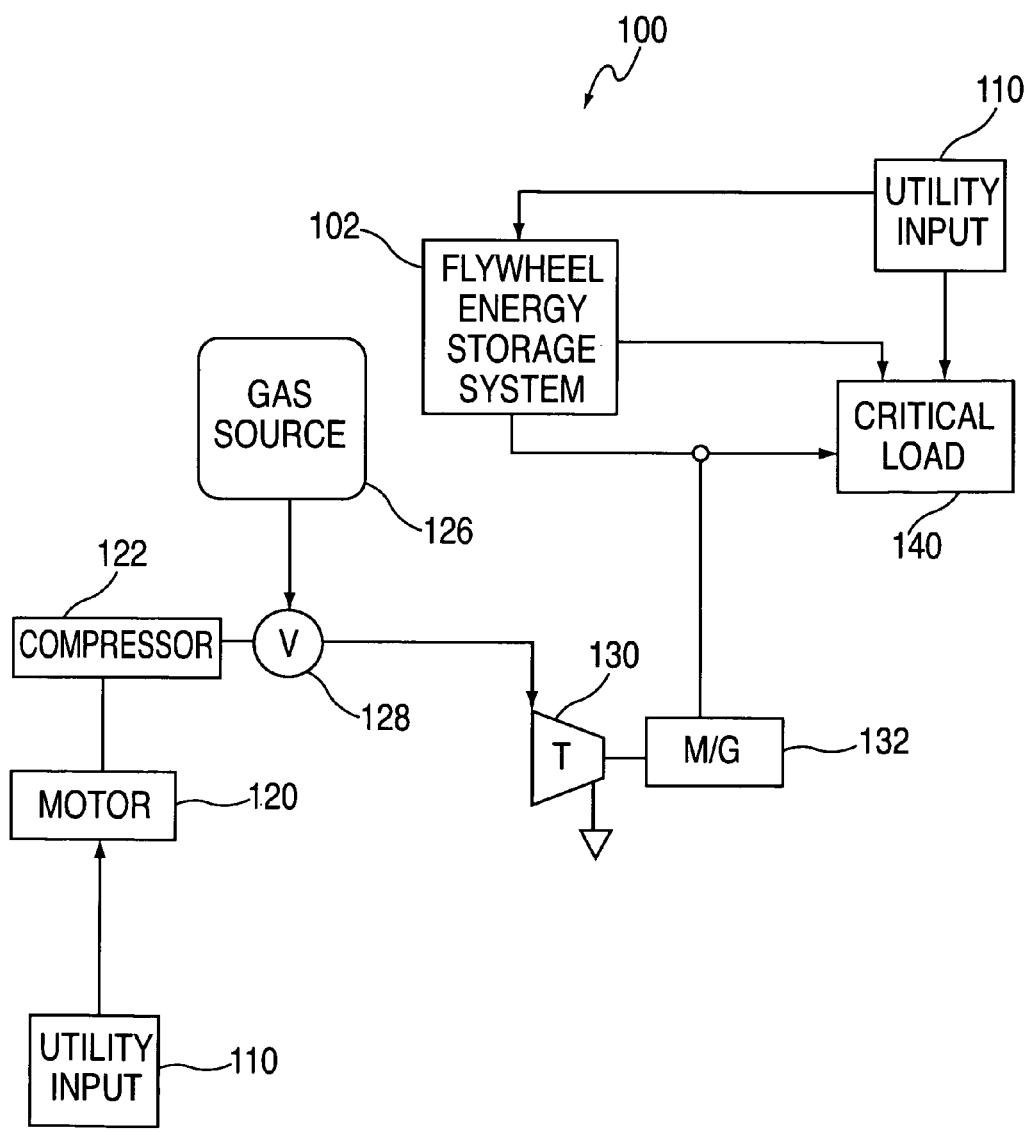
FIG. 1 is a schematic of a backup energy system and a flywheel energy storage system in accordance with the present invention.

FIG. 1 shows a block diagram of a compressed air storage (CAS) backup energy system 100, including a flywheel energy storage system in accordance with the present invention, for providing backup power to a load. Backup energy system 100 includes utility input 110 which supplies power to critical load 140 during normal operating conditions. Persons skilled in the art will appreciate that utility input 110 may be any suitable type of primary power source. As illustrated in FIG. 1, backup energy system 100 includes a flywheel energy system 102 according to the principles of the present invention integrated with the components of a CAS system in order to provide backup power to critical load 140. Backup energy system 100 includes motor 120, compressor 122, gas source 126 (e.g., pressure tank), valve 128, turbine 130 and electrical machine 132.

During normal operating conditions, utility input 110 supplies critical load 140 with power. Utility power 110 also provides bridging energy system 102 with power so that it can overcome steady-state operating losses and store energy to be used, for example, during a power outage. Additionally, utility input 110 may power motor 120 which drives compressor 122 such that compressed air is routed through valve 128 and stored in gas source 126. It is understood that gas source 126 may by any suitable type of compressed air reservoir, such as an underground salt dome, pressure tank, or compressed air cylinders. It is further understood that if gas source 126 is a pressure tank or a compressed air cylinder, one or more pressure tanks or compressed air cylinders may be used in system 100.

Compressor 122 can be any suitable type of compressor which compacts or compresses gas (e.g., atmospheric air) to occupy a smaller space inside of gas source 126. Valve 128 may be a conventional valve or any other suitable device for selectively permitting or preventing the flow of air. Moreover, rather than using a single valve 128 to direct the flow of gas from compressor 122 to pressure tank 126 and from pressure tank 126 to turbine 130, two separate valves may be used. For example, one valve may be used to route gas to a thermal storage unit (discussed below in connection with FIG. 2) and the other may be used to bypass the thermal storage unit.

When there is an interruption in utility power, stored energy in flywheel energy storage system 102 is used to power critical load 140 during at least a portion of the interruption. As defined herein, an interruption of power supplied by a primary power source may be an interruption in the supply of power that may cause a load failure. For example, a momentary interruption (e.g., a fraction of a second) in the supply of power may cause certain loads to fail. Depending on the severity of the interruption, control circuitry (not shown) may cause valve 128 to open to allowed compressed gas to be routed to turbine 130. As will be explained more fully in detail below, it may not be necessary to discharge compressed gas from the gas source 126 each time there is an interruption in the supply of primary power. For example, depending on the length and severity, of the interruption, flywheel energy storage system 102 may provide sufficient power to ride through the interruption, without requiring production of power by electrical machine 132.

When turbine 130 is driven by the compressed gas, it powers electrical machine 132 to provide power to critical load 140. Turbine 130 may be an air turbine of any suitable topology (impulse, reaction, combustion etc.), air motor, or other compressed gas expansion engine capable of attaining power generation speeds relatively quickly (e.g., less than a second).

Such a relatively high-speed ramp-up in power generation may provide a basis for enabling flywheel energy generation system 102 to be designed for "extreme" transient operation in accordance with the principles of the present invention. That is, because the turbine 130 and generator 132 can begin generating power relatively quickly, flywheel system 102 may be designed to operate at current and/or thermal levels that may cause flywheel system 102 to cease functioning properly or result in its destruction if it operates at such current and/or thermal levels beyond the time period required of the turbine 130 and electrical machine 132 to provide power to and fully sustain critical load 140 independent of flywheel system 102.

There may be several stages in which backup energy system 100 provides power to critical load 140 during an interruption in primary power source 110. In a first stage, flywheel energy system 102 may be the sole energy source from which power is derived and provided to the load. In a second stage, both the flywheel energy system 102 and the compressed gas which is used to power turbine 130, which in turn powers electrical machine 132 may provide energy from which power is derived and provided to critical load 140. In a third stage, the compressed gas which is used to power turbine 130, which in turn powers electrical machine 132 is the sole source of energy from which power is derived and provided to critical load 140.

During the third stage, flywheel energy system 102 may draw power from the electrical machine 132 to recharge (e.g., motor the system to return the flywheel to a standby rotational speed). By at least partially recharging flywheel energy system 102, it may be able to assist electrical machine 132 in accommodating step changes in critical load 140 by selectively providing power to critical load 140.

Figure 2:
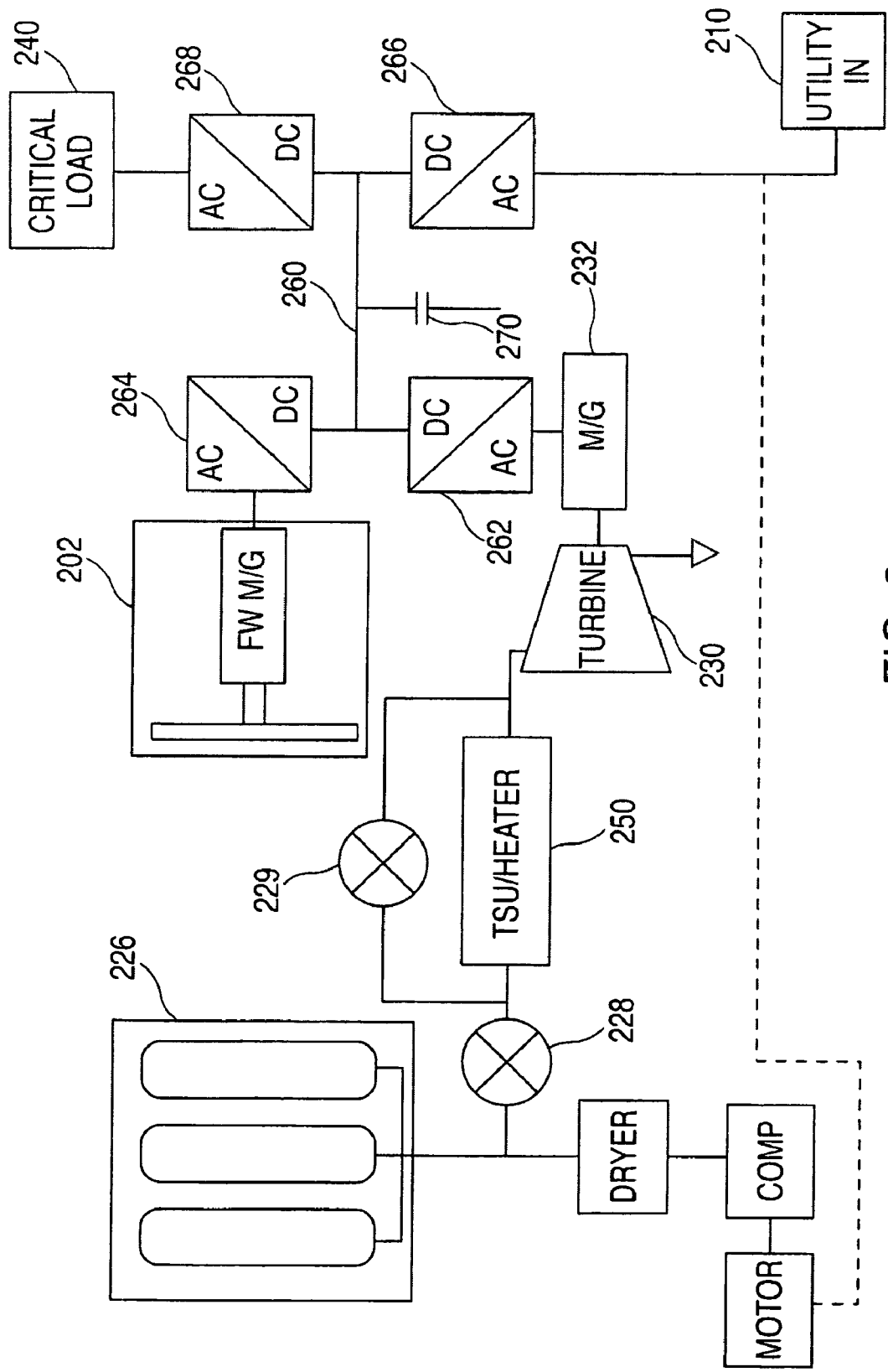
FIG. 2 is a schematic of another backup energy system and a flywheel energy storage system in accordance with the present invention.

FIG. 2 shows a block diagram of thermal and compressed air storage (TACAS) backup energy system 200, including a flywheel energy storage system in accordance with the principles of the present invention, for providing backup power to a load. System 200 includes many of the same elements as system 100 of FIG. 1. It is noted that, for convenience and clarity, similar components of different embodiments are similarly numbered. For example, the gas source of FIG. 1 is numbered "126" (where 1XX generally refers to elements identified in FIG. 1), while the gas source in FIG. 2 is numbered "226." Therefore, the similarly numbered elements will not be discussed. System 200 includes a thermal storage unit 250, located between valve 228 and turbine 230. A bypass valve 229 may provide a bypass path for allowing compressed gas to bypass thermal storage unit 250. A DC bus 260, conversion circuitry 262, 264, 266, and 268, and capacitor 270 may be provided. Conversion circuitry 262, 264, 266, and 268 may be controlled by control circuitry (not shown). During normal operation, primary power source 210 may supply power to conversion circuitry 266, which may rectify the power to provide DC power for DC bus 260. Power on DC bus 260 may be provided to conversion circuitry 268, which may invert the DC power to AC power for critical load 240. Also, during the normal mode of operation, power on DC bus 260 may be supplied to flywheel energy generation system 202 by way of conversion circuitry 264. Conversion circuitry 264 may invert the DC signal provided by DC bus 260 to a desired AC signal suitable for controlling the motoring function of flywheel energy generation system 202.

During a backup mode of operation (e.g., when primary power source 210 is interrupted), flywheel energy storage system 202 and electrical machine 232 may provide power to DC bus 260, via conversion circuitry 264 and 262, respectively. The power on the DC bus may then be provided to critical load 240 via conversion circuitry 268. Additional details of how the motoring and generating functions of flywheel energy generation system 202 operate with respect to conversion circuitry 264 and DC bus 260 are discussed below.

Figure 3:
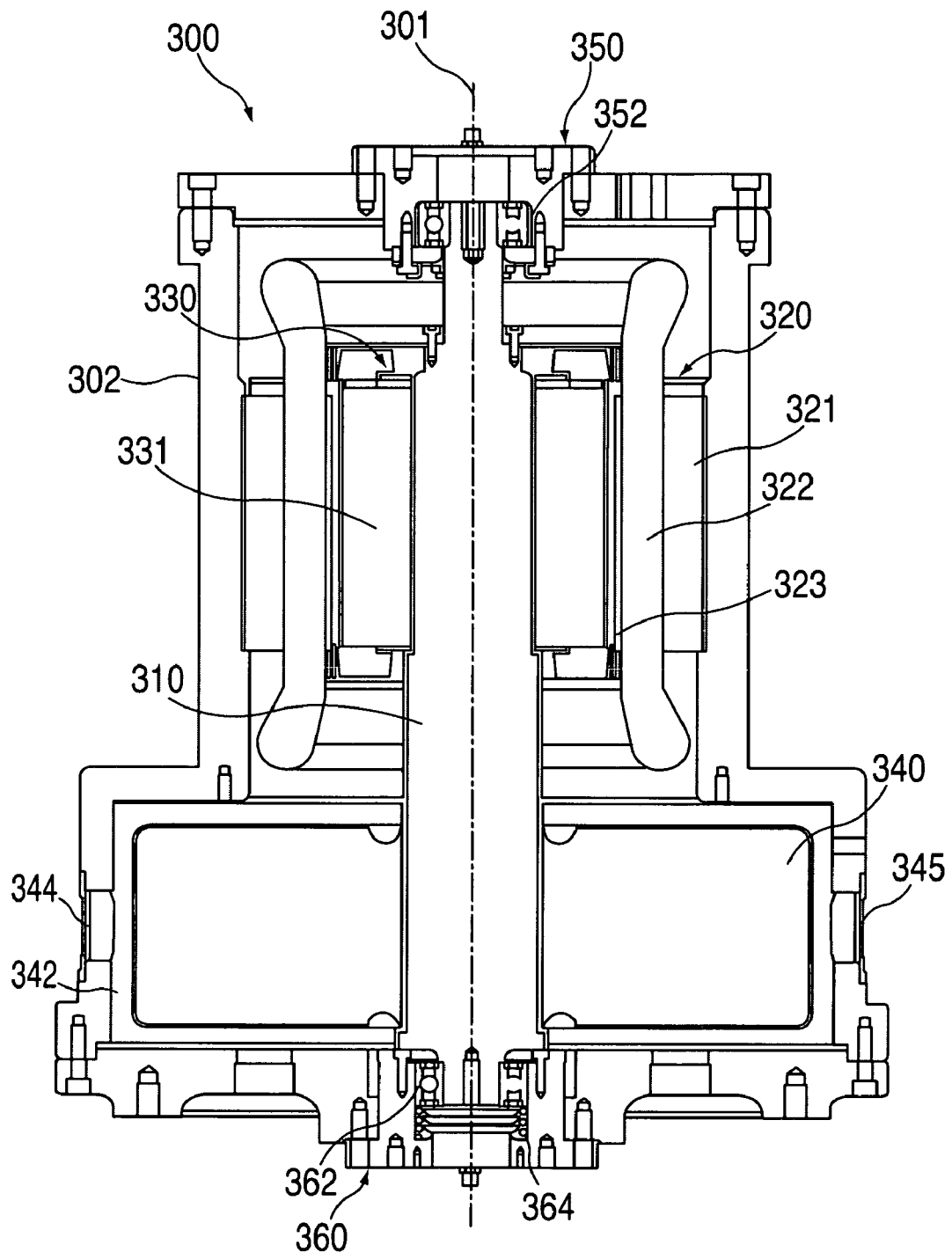
FIG. 3 is a cross-sectional view of a vertically aligned flywheel energy storage system in accordance with the present invention.

FIG. 3 is a cross-sectional view of a vertically aligned flywheel energy storage system 300 in accordance with the principles of the present invention. Flywheel system 300 includes, generally, an induction motor/generator portion (generally shown in the top half of the FIG.) and a flywheel portion (generally shown in the bottom half of the FIG.), both of which may be contained within frame 302. The frame may be a NEMA frame of a predetermined size (e.g., NEMA 254, 256, 326, etc.). The motor/generator portion may include stator circuitry 320 (shown generally as laminated steel stator core 321 and stator winding 322) and rotor circuitry 330 (shown generally as laminated steel rotor core 331 and rotor bars 332) coupled to shaft 310. Rotor circuitry 330 as known in the art is sometimes referred to as a squirrel-cage rotor. Stator circuitry 320 may be permanently mounted to frame 302 and rotor circuitry 330 may rotate about vertical axis 301 in conjunction with shaft 310. Shaft 310 may be mounted within system 300 by bearing housing assemblies 350 and 360, which include bearings 352 and 362 respectively. Bearings 352 and 362 may be grease lubricated anti-friction bearings, sleeve-type bearings, gas lubricated bearings, magnetic bearings or other suitable type of bearings.

Shaft 310, rotor circuitry 330, and flywheel 340 collectively constitute the rotational member or assembly of flywheel system 300 and may be referred to as the rotor or rotor assembly. The rotational member generally refers to the portion of system 300 that rotates about vertical axis 301 and may include other components not specifically mentioned herein. The rotational member may be suspended by bearing assembly 350 and supported by bearing assembly 360.

Flywheel 340 may be coupled to shaft 310 and is operative to rotate about vertical axis 301 within chamber 342. Chamber 342 may be exposed to atmospheric pressure via exhaust ports 344 and 345. An advantage of including flywheel 340 in a unitary frame construction (for containing essentially all moving elements) provides for cooling of elements (e.g., stator and rotor circuitry and bearings) within flywheel system 300. Such cooling may be accomplished by using the spinning flywheel 340 as a single-disc Tesla pump. When operating as a Tesla pump, air may be pulled in from the ambient environment (via air gaps in flywheel system 300) and directed along the vertical axis 301 towards flywheel 340, where the air is ejected at the flywheel's outer radius, or more particularly exhaust ports 344 and 345. It is understood that any number of exhaust ports may be present in chamber 342.

Figure 4:
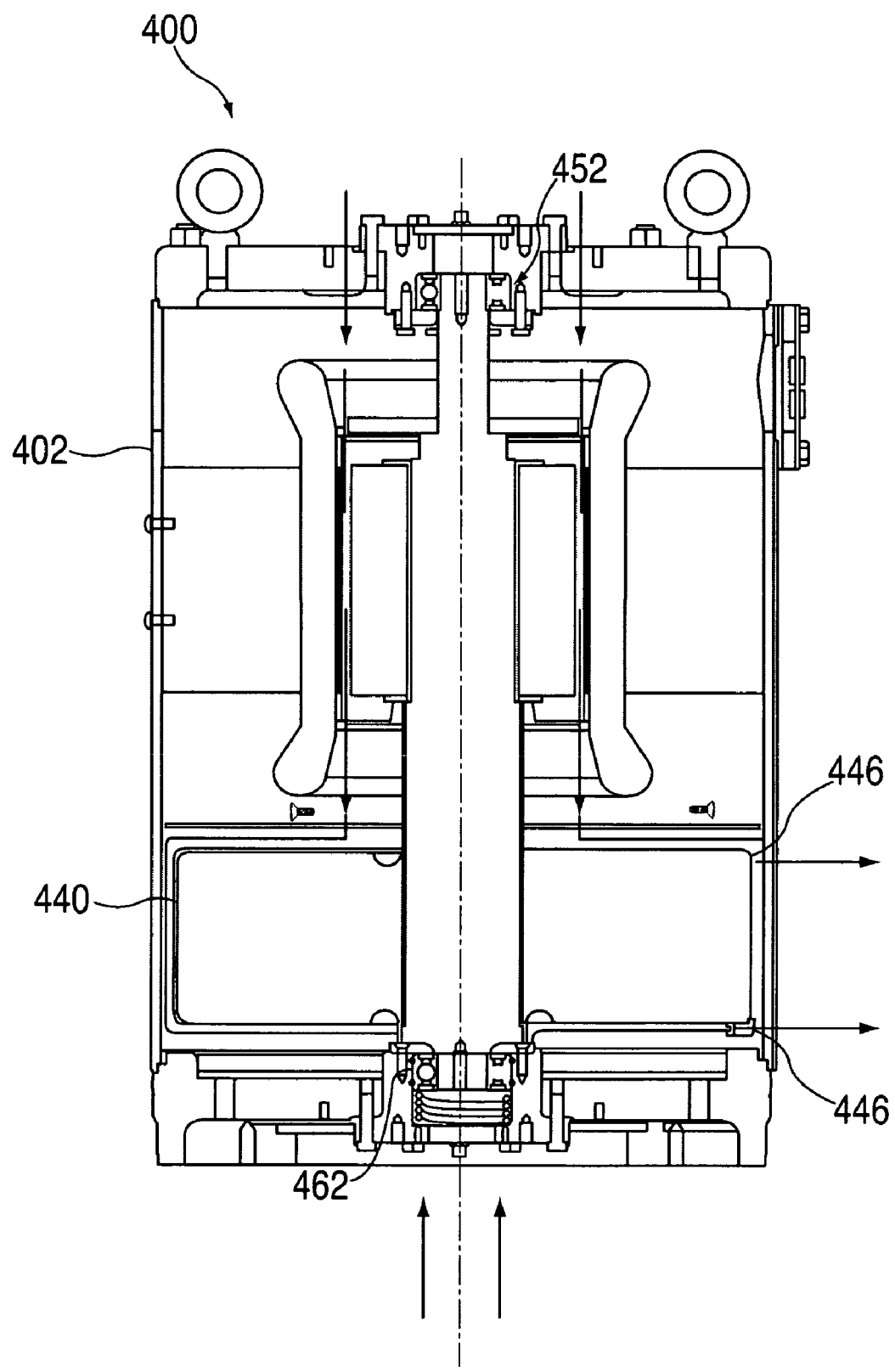
FIG. 4 is a cross-sectional view of another vertically aligned flywheel energy storage system in accordance with the present invention.

The rotation of shaft 310 (and flywheel 340) causes a pressure drop from shaft 310 to the outward periphery of flywheel 340. As illustrated in FIG. 4, which shows an alternative flywheel energy storage system 400 having a unitary frame construction in accordance with the principles of the present invention, this pressure drop produces a pumping action which pulls cool, ambient air (shown by arrow lines) into system 400, from both the top and bottom portions of flywheel system 400, such that the air is pulled across bearings 452 and 462, and other components within frame 402. The air extracts heat from the elements of system 400 and carries the heat away from system 400 when expelled from one or more exhaust ports 446 located around the periphery of flywheel 440 to the ambient environment.

Note that although FIGS. 3 and 4 describe flywheel systems having a unitary frame, it is understood that various embodiments of the present invention may be practiced in flywheel systems having a "two-part" construction. For example, a "two-part" construction may be a system where the motor/generator portion and the flywheel portion are housed in separate housings or frames, but share a common shaft which extends between both housings. The "two-part" construction may not realize the benefit of the Tesla pump action that enables elements of the motor/generator portion to be cooled, but the Tesla pump action may be utilized to cool, for example, a bearing supporting the rotor in the flywheel portion.

A considerable amount of noise may be generated as air is ejected from the flywheel system due to the flywheel's pumping action. To reduce noise, the exhaust ports (e.g., ports 446) may be shaped or shrouded to reduce edge noise (of the flywheel) and flow noise produced by the airflow out of the exhaust ports. Different port shapes and sizes may affect the amplitude and frequency spectrum of the generated noise.

Figure 5:
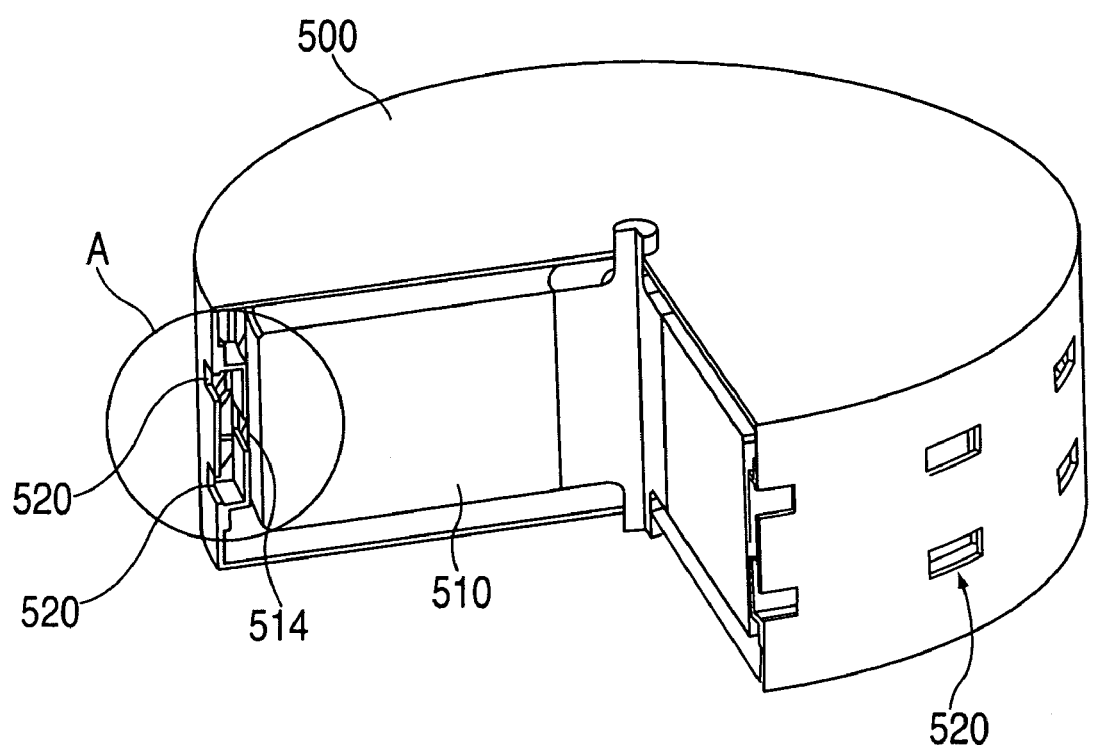
FIG. 5 shows a three-dimensional cutaway view of a flywheel noise reduction enclosure of a flywheel system in accordance with the principles of the present invention.

FIG. 5 shows a three-dimensional cutaway view of a flywheel noise reduction enclosure 500 of a flywheel system in accordance with the principles of the present invention. Enclosure 500 may be integrated with the frame (not shown) of the flywheel system such that it forms part of a unitary frame construction as discussed above. Alternatively, enclosure 500 may be housed internal to the frame (not shown) in which case, the exhaust air may be vented out of ports of the frame itself.

As shown, enclosure 500 encloses flywheel 510 and includes a noise reduction structure extending around the periphery of flywheel 510. The noise reduction structure includes inner and outer exhaust ports arranged in multiple layers so as to create a shrouding effect that dampens noise (e.g., flow noise and edge noise). In particular, inner exhaust ports 514 are fluidically coupled to the interior space of enclosure 500. Outer exhaust ports 520 are fluidically coupled to an atmospheric environment (e.g., the room in which the motor/generator is located). Outer exhaust ports 520 may be offset with respect to the position of inner exhaust ports 514 to provide a baffle through which the air flow must traverse to pass from the interior to the exterior of the enclosure. The spatial relationship between the inner and outer exhaust ports is shown in more detail in FIG. 5A, which details the circled region A of FIG. 5.

Figure 5C:
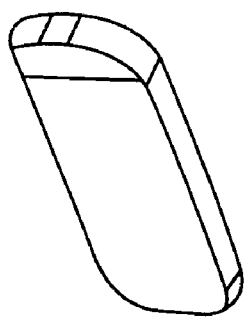
FIGS. 5B-D show different exhaust ports that may be included in the flywheel noise reduction enclosure of FIG. 5 in accordance with the principles of the present invention.
Figure 5D:
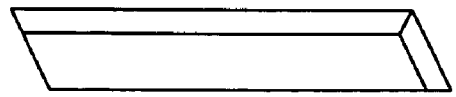
Figure 5B:
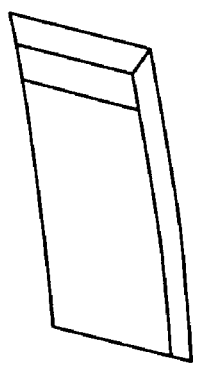
Figure 5A:
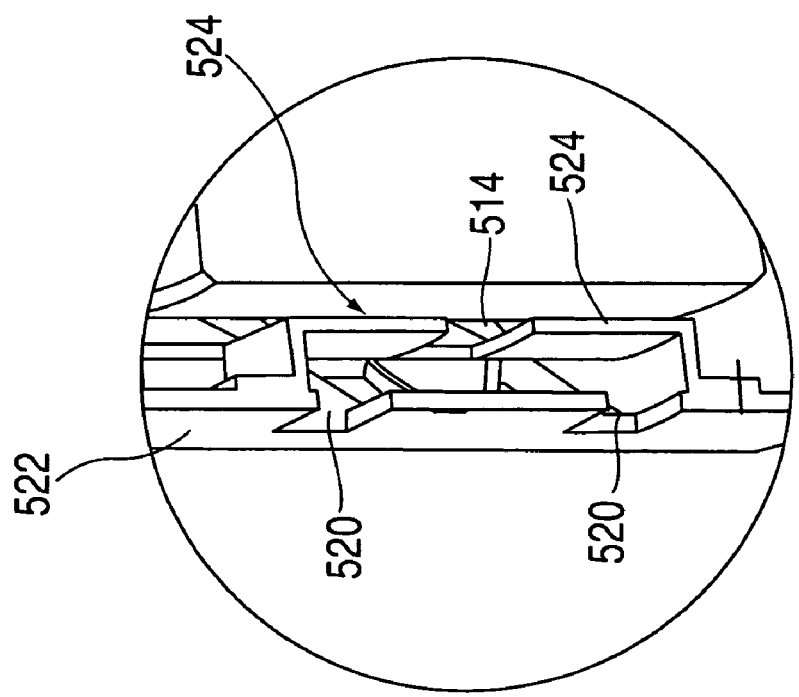
FIG. 5A shows a more detailed three-dimensional view of portion of the flywheel noise reduction enclosure of FIG. 5 in accordance with the principles of the present invention.

FIG. 5A shows inner exhaust port 514 is located between outer exhaust ports 520. More particularly, FIG. 5A shows that outer exhaust ports 520 are included as an outer layer 522 of enclosure 500 and inner exhaust port 514 is included as part of an inner layer 524. Inner layer 524 may be constructed in discrete sections positioned, for example, proximal to outer exhaust ports 520. Such discrete construction may result in several inner exhaust ports 514. Alternatively, inner layer 524 may span continuously around the inside periphery of enclosure 500 (not shown), resulting in a single inner exhaust port 514 spanning around the periphery of the flywheel. The actual construction is largely a matter of design choice though it is understood that various designs (e.g., such as shape and size of inner and outer exhaust ports) may affect the quality of noise reduction and air flow characteristics. For example, the baffling may reduce the rate of air flow from the interior of enclosure 500 to the ambient environment, but the baffling creates a slower, less turbulent, and therefore quieter air flow. FIGS. 5B-D illustrate three examples of inner and outer exhaust port shapes and orientations that may be used to reduce the flow noise.

Referring back to FIG. 3, systems and methods for reducing or balancing loads of least one bearing in accordance with the principles of the present invention are now discussed. As discussed above, the rotational assembly may be suspended by bearing assembly 350 (e.g., the upper bearing assembly), where the axial load due to the weight of the rotational assembly is borne substantially by bearing 352, and radial loads due to unbalance forces and lateral magnetic pull between the rotor and stator circuitry are shared by bearing assemblies 350 and 360. Bearing 352 is frequently referred to as the thrust bearing and is generally constrained to limited axial motion relative to the machine housing. Bearing 360 is frequently referred to as the non-thrust or floating bearing and must be free to move axially relative to the machine housing to accommodate differences in thermal expansion between the rotating assembly and housing. In one embodiment, as shown in FIG. 3, bearing assembly 360 may be constructed to include a spring 364 that provides a predetermined upward force to bearing 362. This force reduces the load borne by bearing 352 and imparts an axial preload to bearing 362 that is necessary for proper operation. In one approach, spring 364 may apply an upward preload force that is approximately equal to one half the weight of the rotational assembly. By providing an upward preload force of approximately one half the weight of the rotational assembly, the load borne by the upper and lower bearings may be equalized. This advantageously allows the upper and lower bearings to be equally sized and results in comparable life expectancies of the bearings.

Spring 364 may be a low stiffness spring (i.e., a spring with a low force/deflection constant).

It may be desirable to provide the upward preload force through a relatively large deflection of a low stiffness spring rather than a relatively small deflection of a high stiffness spring. In particular, a large deflection of a low stiffness spring minimizes the variation in preload force that results from installation tolerances and differential thermal expansion between the rotor assembly and machine housing. For example, for a nominal rotational assembly weight of 300 pounds, the desired upward preload force may be 150 pounds. A reasonable installed deflection of the compression spring may be 1.0 inch, which requires a spring constant of 150 lb/in. Therefore, an installation tolerance of 0.050 inches may result in a 7.5 pound variation in the preload force (e.g., 5% of nominal). In contrast, if a higher stiffness spring is used to apply the same upward preload force (using, for example, a spring having a 300 lb/in constant). Thus the same installation tolerance (e.g., 0.050 inches) may result in a 15 pound variation in the preload force (e.g., 10% of nominal).

Figure 6:
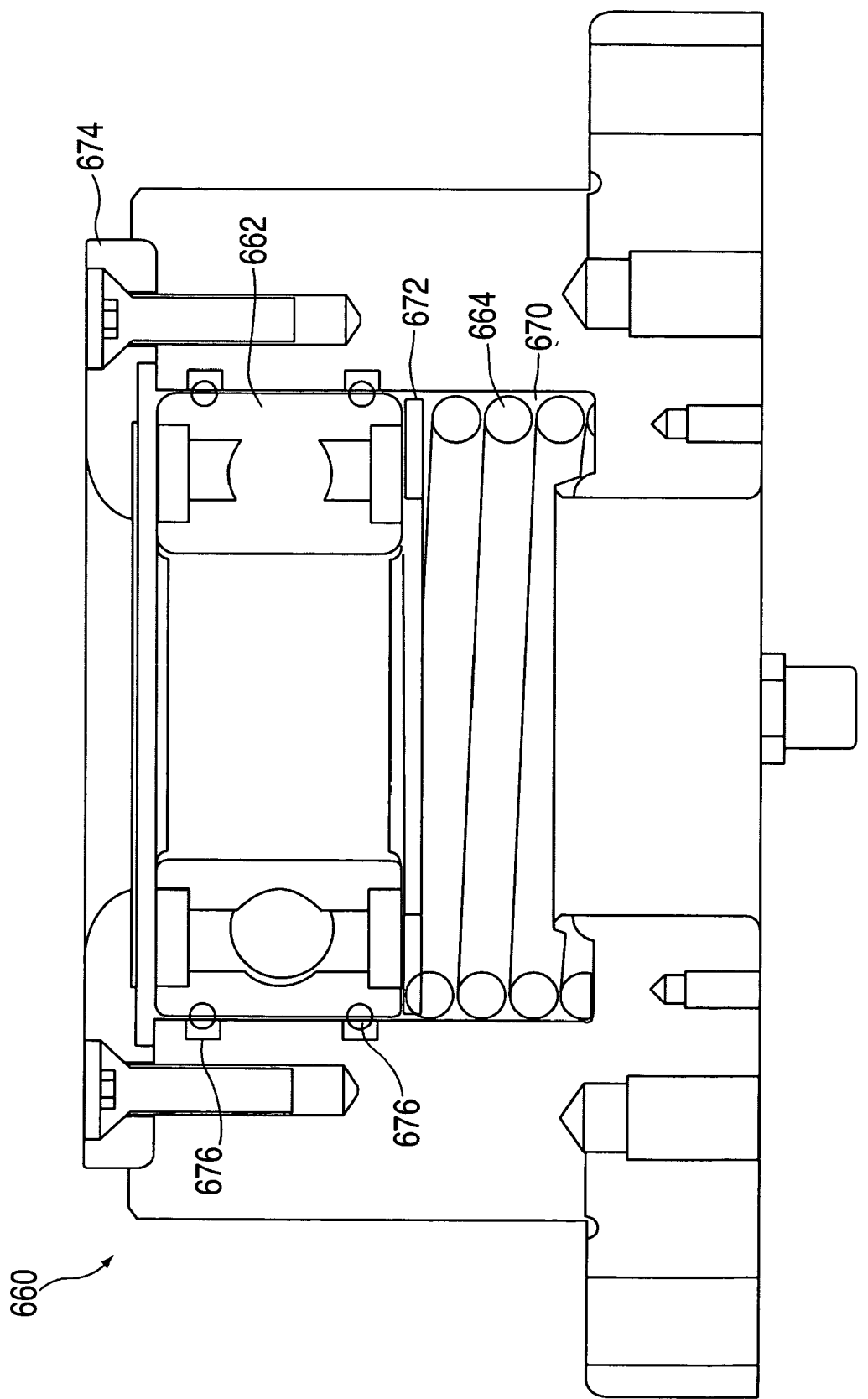
FIG. 6 shows an enlarged cross-sectional view of a bearing housing for reducing a load on the bearing in accordance with the principles of the present invention.
Figure 7:
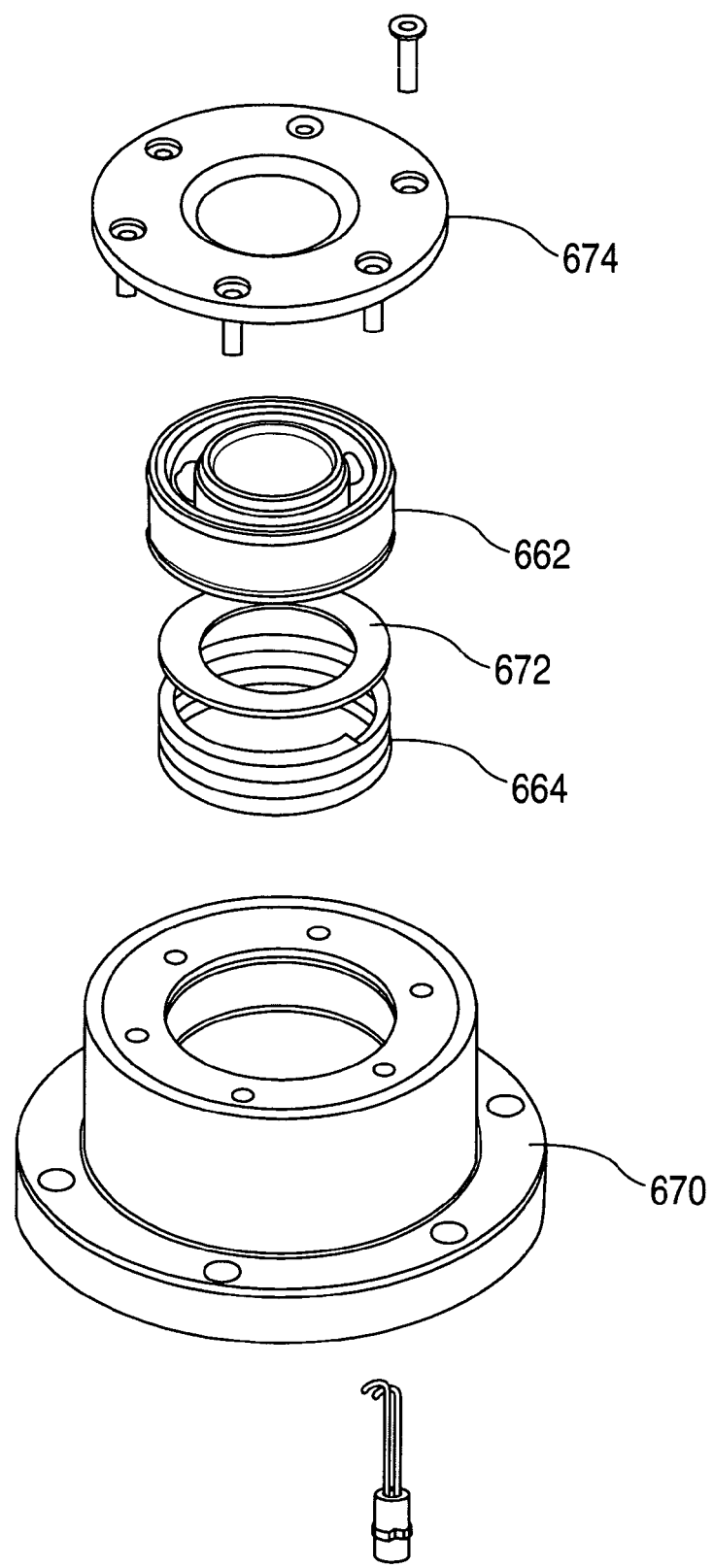
FIG. 7 shows an exploded assembly view of the bearing housing of FIG. 6 in accordance with the principles of the present invention.

FIG. 6 shows an enlarged cross-sectional view of bearing housing (e.g., bearing housing 360 of FIG. 3) in accordance with the principles of the present invention. FIG. 7 shows an exploded assembly view of the bearing housing of FIG. 6 in accordance with the principles of the present invention. Reference will be made to both FIGS. 6 and 7 in the following discussion. As shown, housing 660 includes a bearing cartridge pocket 670 in which spring 664, washer 672, and bearing 662 reside and are held in place by bearing retainer 674. Membranes 676 (e.g., o-rings) may be used to provide a resilient mounting of bearing 662 within bearing cartridge pocket 670. When constructed, spring 664 applies an upward force to the washer 672, which in turn translates that upward force to the outer race of bearing 662. As is known in the art, bearings typically include an outer race, an inner race, and roller elements (e.g., ball bearings) fixed between the outer and inner races. In flywheel systems according to this invention, the shaft is mounted flush against the inner race. Thus, the inner race rotates, while the outer race remains stationary.

It is known that without assistance of a load reducing or load balancing system or method, vertical orientation of flywheel system 300 may place a majority of the weight of the rotational member (e.g., combination of shaft 310, rotor circuitry 330, and flywheel 340) on thrust bearing 352. Thus, but for such a system or method, thrust bearing 352 may succumb to wear and tear faster than floating bearing 362. It is understood that the principles of this invention apply if bearing 362 is used as the thrust bearing and bearing 352 is the floating bearing if the preload spring is applied in the upward direction to the outer race of bearing 352.

Figure 8:
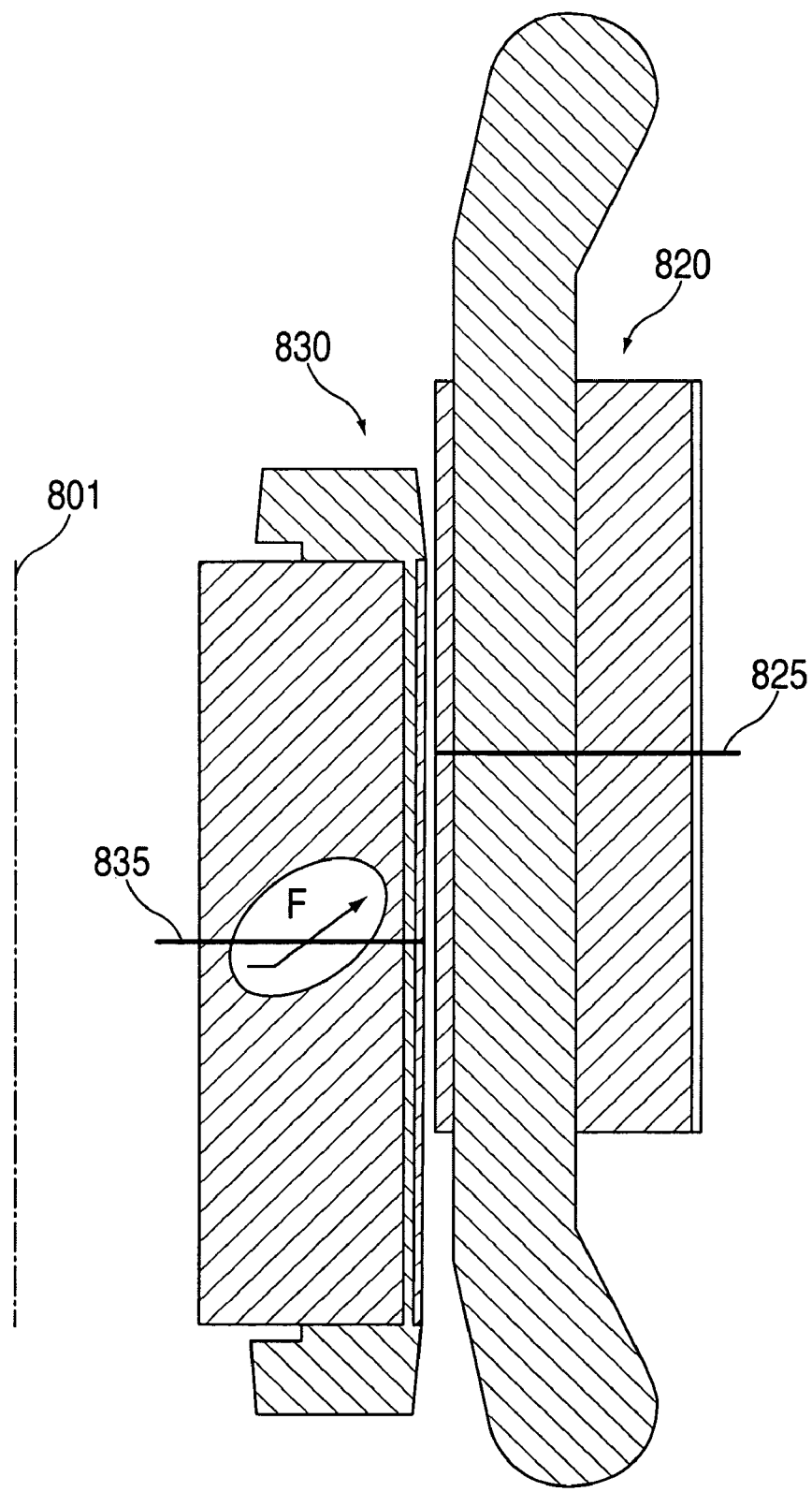
FIG. 8 shows a partial cross-sectional view of a motor/generator portion of a flywheel energy storage system which is constructed to reduce a load applied to a bearing in accordance with the principles of the present invention.

FIG. 8 shows a partial cross-sectional view of a motor/generator portion of a flywheel energy storage system which is constructed to reduce a load applied to a lower bearing in accordance with the principles of the present invention. FIG. 8 illustrates an embodiment in which a difference in magnetic centering between stator circuitry 820 and rotor circuitry 830 may be used to create an axial force to reduce the load applied to a lower bearing (not shown) or equalizes a load seen by both upper and lower bearings (not shown). As defined herein, a magnetic center is the point of maximum magnetic coupling between the rotor and stator electrical circuits.

In conventional motor/generator arrangements, such as that shown in FIG. 3, the magnetic centers of the rotor and stator circuitry may be co-aligned to maximize flux between the rotor and stator and minimize deleterious thrust loading on bearings. In addition, such an arrangement maximizes the rotational force that may be applied to rotate the rotational assembly (only a portion of which is shown). When the magnetic centers of the rotor and stator circuitry are centered with respect to each other on vertical axis 801, substantially no net force is produced in a vertical direction (along vertical axis 801) when the flywheel system is operating in a motor mode or generator mode.

In FIG. 8, rotor circuitry 830 may be shifted in a vertical direction (e.g., downward) with respect to stator circuitry 820 such that magnetic center of rotor circuitry 830 (shown as line 835) is offset with respect to the magnetic center of stator circuitry 820 (shown as line 825). This offset (or vertical misalignment) of magnetic centers may induce an upward force F when the induction motor/generator is being operated as a motor. Force F has a net force component in the upward vertical direction that serves as an axial force that "pulls" rotor circuitry 830 (and by extension the rotational assembly) up, thereby reducing the load on the lower bearing (not shown). An upward force is produced because the magnetic center of rotor circuitry 830 is vertically aligned below the magnetic center of stator circuitry 820. By contrast, if the magnetic center of rotor circuitry 830 is positioned above the magnetic center of stator circuitry 820, a downward vertical axial force may be produced. Thus, when the motor/generator is operating in a motor mode, there is a natural tendency for the magnetic centers to line up. Therefore, regardless of the vertical direction in the offsets of magnetic centers, an offset of magnetic centers results in an axial force in a vertical direction.

The strength of the axial force may be based on a number of factors, including, for example, the magnetic field strength of rotor circuitry 830 and stator circuitry 820, the offset distance, the size of the motor/generator, and any other suitable factors. The strength of the axial force may be designed to counteract a predetermined portion of the load applied to the lower bearing (e.g., bearing 362) when the lower bearing is being used as the thrust bearing. For example, the axial force may be approximately equal to the load applied to a lower bearing by a rotational assembly (not shown) which may include the rotor circuitry, shaft, and flywheel. In another example, the axial force may be such that the load borne by both the upper and lower bearings is approximately equal.

The motor/generator portion of the flywheel energy storage systems according to the invention is constructed as an induction motor generator (referred to herein as an "IMG"). More particularly, the IMG is constructed to have a squirrel cage rotor.

Figure 17A:
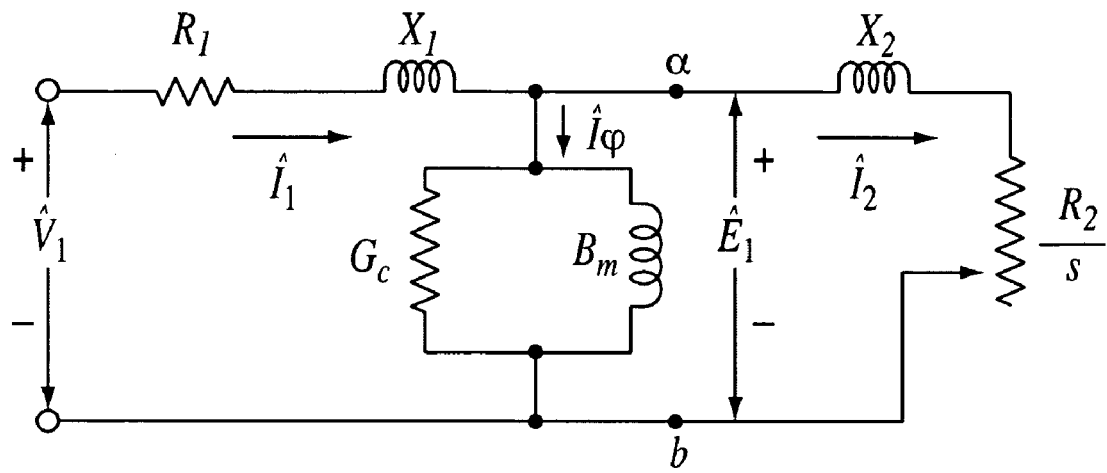
FIG. 17A shows an equivalent circuit diagram for an induction motor.

FIG. 17A shows an equivalent circuit diagram of an induction motor/generator. $R_1$ and $X_1$ are the stator winding resistance and leakage reactance, respectively. $R_2$ and $X_2$ are the rotor or armature winding resistance and leakage reactance (as seen from the stator), respectively. $B_m$ (also referred to herein as $X_m$) is the magnetizing reactance or the mutual reactance between the rotor and stator. Gc is a parameter representing the iron losses in the machine and is often neglected in the evaluation of the equivalent circuit. $V_1$ is the applied stator voltage, $I_1$ is the total current, $I_\phi$ is the magnetizing or excitation current and $I_2$ is the rotor current as seen from the stator. The variable s represents the slip or relative velocity between the rotational speed of the rotor and the rotational speed of the stator magnetic field.

Figure 17B:
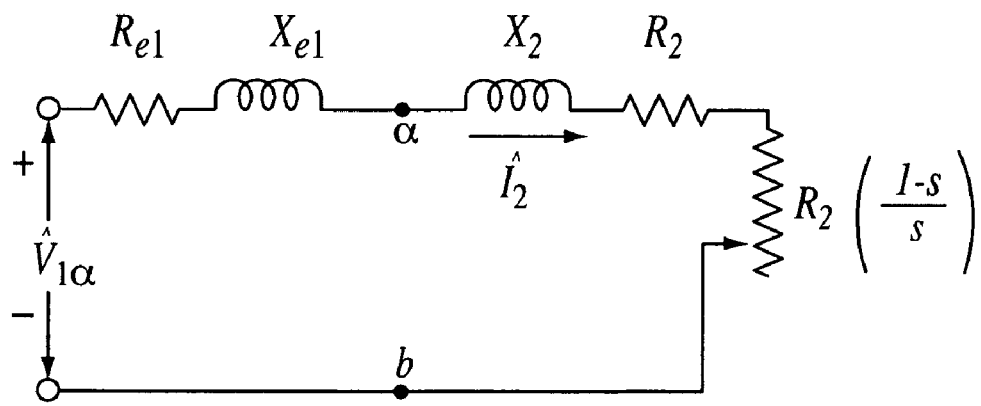
FIG. 17B shows an induction motor equivalent circuit diagram simplified by Thevenin's Theorem.

FIG. 17B shows the equivalent circuit diagram of FIG. 17A which as been simplified by Thevenin's Theorem. As shown, $V_1$, is changed to $V1a$, $X1$ and $Xm$ is changed to $Xe1$, and $R1$ is changed $Re1$. A brief description of how an IMG operates is now provided.

A three-phase set of sinusoidal voltages of predetermined magnitude, frequency and phase may be applied to the stator (e.g., stator 311) which causes current to flow through the stator windings. This current is made up of 2 components, $I_\phi$ and $I_2$, which may be referred to as the magnetizing current and torque producing current, respectively. The magnetizing current in the stator creates a rotating stator magnetic field that passes over the rotor circuitry (e.g., bars and windings) and induces a voltage therein. It is the relative, mechanical motion of the rotor compared to the motion of the stator magnetic field that produces the induced voltage in the rotor circuitry. This induced voltage, in turn, induces current flow through the rotor circuitry. The flowing current produces a rotor magnetic field which rotates in the same direction as the stator field.

As stated above, the voltage induced in the rotor depends on the rotational speed of the rotor relative to the rotational speed of the stator field. The rotational speed of the stator field is referred to as the synchronous speed. A term commonly used to define the rotational speed of the rotor relative to synchronous speed is "slip speed." The term "slip" defines the relative speed in terms of a percentage or per-unit basis. For example, when the slip is 0, the rotor is rotating at synchronous speed. When the slip is 1, the rotor is stopped. Slip speed may be defined by equation 1.

$$n_{slip} = n_{sync} - n_m \quad (1)$$

wherein $n_{slip}$ is the slip speed of the machine, $n_{sync}$ is the speed of the magnetic fields, and $n_m$ is the mechanical speed of the rotor. Slip may be defined in equation 2.

$$s = ((n_{sync} - n_m)/n_{sync}) \quad (2)$$

Note that the direction of the torque on the rotor is dependent on the direction of slip. In the motoring mode, as previously discussed, the rotor spins at a slower than synchronous speed resulting in a torque in the direction of rotation that tends to restore the rotor to the faster synchronous speed. This corresponds to a slip between 0 and 1. While motoring, both torque producing current and magnetizing current are being consumed by the IMG. In generator mode, the rotor spins faster than synchronous speed resulting in a torque opposite the direction of rotation that tends to restore the rotor to the slower synchronous speed. This in turn corresponds to a slip between 0 and −1. In this mode, torque producing current is being supplied by the IMG but magnetizing current is still consumed. Note that magnetizing current is consumed in both motoring and generating modes. While magnetizing current can sometimes be provided via self excitation, an external source, such as the capacitors of a DC bus, may be required.

The amplitude, frequency and phase of the voltages applied to the stator may determine the synchronous speed, magnitude and phase of the stator current, $I_1$. Control circuitry may be used to control the frequency and amplitude of the magnetizing current and the amplitude of the torque producing component of current. By selectively varying the amplitude, frequency and phase of the applied voltages, the IMG can be selectively transitioned to and from motoring and generating modes with additional control over the amount of power consumed or supplied by the IMG.

The flywheel energy system according to the present invention is designed for transient power generation. That is, the motor/generator portion may spend a majority of its operational life in a motoring mode and a minority in a generating mode. For example, the flywheel energy system may be designed to discharge practically all usable energy to a critical load (and a DC bus) in a very short period of time (e.g., ranging from a fraction of a second to a second or two). This is in contrast with continuous duty motor/generators which may generate power for a majority of their operational lives (e.g., a motor/generator operating in connection with a wind-powered turbine).

In general, the IMG of the present invention is constructed to switch from a low power motoring mode (e.g., standby mode) to a maximum power generating mode (e.g., discharge mode) within a suitably small timeframe and provide at least a minimum quantity of power to a critical load and DC bus. It is desirable for the IMG to operate in a low power motoring mode to increase efficiency and reduce heating. As will be explained in greater detail below, power is provided by a primary power source and DC bus (e.g., DC bus 260) via conversion circuitry (e.g., conversion circuitry 264) to the stator circuitry of the IMG during the motoring mode. The conversion circuitry may limit the quantity of power supplied to the stator circuitry by adjusting a duty cycle (e.g., by adjusting the duty cycle of a DC-to-AC conversion). More particularly, the conversion circuitry may reduce the voltage (or RMS voltage) provided to the stator circuitry to reduce the amount of magnetizing current with subsequent reduction in the amplitude of the stator field. It is understood that the conversion circuitry may be responsible for adjusting the frequency of the excitation current to control the slip.

It is understood that during an initial startup or a ramp up in rotational speed of the flywheel energy storage system, the conversion circuitry may provide a higher voltage to the stator circuitry than when the flywheel is already at speed. Also, the conversion circuitry may be responsible for adjusting the frequency of the excitation current to control the slip.

The IMG of the present invention transitions from a low power motoring mode to a high power generating mode within a short enough timeframe to prevent the DC bus from falling below critical voltage limits and restores the DC bus to a predetermined voltage within 1 to 3 line cycles. That is, the IMG must transition fast enough to ensure power is provided to the critical load in the event of a disturbance in the supply of power from the primary power source.

An advantage of the flywheel energy storage system according to the invention is that it is used for transient operation, and therefore the motor/generator of such a system may be optimized for transient power generation without being limited by the constraints that affect continuous duty motors and generators. The response time of the IMG can be optimized by proper design of the rotor and stator circuitry resistances and reactances. Further, the IMG of the present invention may be designed to operate at thermal, mechanical, or electrical limits that may cause conventional continuous duty motors and generators of the same size or power rating to fail. Such thermal, mechanical and electrical levels may be achieved because the high power, generation period is transient. While it may be true that conventional continuous duty motor/generators may operate at overload conditions, the IMG of the present invention differs in both construction and performance as compared to conventional continuous duty motor/generators. By way of comparison, these differences are now discussed.

Tables 1 and 2 compare equivalent circuit data of IMGs according to the present invention, labeled under column heading A, to continuous duty motor/generators of comparable size and to IMG's of comparable power ratings. The IMG in Table 1 is designed to fit within a standard NEMA 326 frame size and is compared to different continuous duty motor/generators manufactured by Marathon Electric, A. O. Smith, and Teco-Westinghouse Motor Company. The IMG in Table 2 is then compared to 2 continuous duty IMG's manufactured by Marathon Electric that have similar power rating but fit within a larger NEMA 404 or 405 frame size. A survey of different manufacturers and NEMA specifications indicate that 326 frame sizes are appropriate for 50 HP (37.5 kW) and that 404 frame sizes are appropriate for 125 HP (93 kW) continuous duty motor/generators. Note that all values are presented in "per unit" based on ratings of 100 kVA and 480 Vrms Line to Line. On a full power discharge, the IMG according to the present invention may provide, for example, approximately 90 kW until the flywheel is completely discharged, the rotor/stator steel becomes saturated, the current limit of the electronics is reached, or a thermal limit is reached.

Toc and Tsc are the open circuit and short circuit time constants, respectively. Ts0 is the time constant associated with changes in IMG's magnetic fields in response to a change in voltage and assumes the slip is 0. Toc, Tsc and Ts0 are functions of the circuit parameters and are calculated as follows:

$$T_{oc} = \frac{X_2 + X_m}{2\pi f \cdot R_2} \qquad (3)$$

$$T_{sc} = T_{oc} \cdot \frac{\left[X_1 + \frac{X_m \cdot X_2}{X_m + X_2}\right]}{X_1 + X_m} \qquad (4)$$

$$T_{s0} = \frac{[X_{e1} + X_2]}{R_{e1}} = \frac{\left[\frac{X_m \cdot (R_1^2 + X_1 \cdot X_m + X_1^2)}{R_1^2 + (X_1 + X_m)^2}\right] + X_2}{\left[\frac{X_m^2 \cdot R_1}{R_1^2 + (X_1 + X_m)^2}\right]} \qquad (5)$$

where f refers to electrical frequency of the applied voltage.

The transient response characteristics of the machine are functions of its reactances and resistances. These parameters may be altered by changing the design and construction of the IMG. Magnetizing reactance can be reduced by decreasing the number of turns, reducing machine volume, increasing the air gap size. Rotor leakage reactance can be reduced by modifying the bar/slot shape and size, reducing the machine volume and increasing the number of bars/slots, increasing

TABLE 1

Comparison of 50 HP, 60 Hz, 2 Pole Induction Motor Data

| MFG | MAR | MAR | MAR | AOS | TECO | TECO | A |
|---|---|---|---|---|---|---|---|
| Cat # | 326TSTGS6001 | 365USTFS4001 | 326TSTFS6501 | E3036 | JM0502 | DH0502 | |
| Frame | 326TS | 365US | 326TS | 326TCS | 326JM | 324TS | 326T |
| HP | 50 | 50 | 50 | 50 | 50 | 50 | |
| RPM | 3600 | 3600 | 3600 | 3600 | 3600 | 3600 | 3600 |
| R1 | 0.069 | 0.067 | 0.069 | 0.056 | 0.051 | 0.0517 | 0.061 |
| R2 | 0.064 | 0.056 | 0.064 | 0.066 | 0.096 | 0.0927 | 0.051 |
| X1 | 0.512 | 0.493 | 0.512 | 0.257 | 0.394 | 0.3921 | 0.162 |
| X2 | 0.43 | 0.439 | 0.431 | 0.643 | 0.699 | 0.6956 | 0.1944 |
| Xm | 18.29 | 18.7 | 18.29 | 24.98 | 27.74 | 25.594 | 4.7475 |
| Toc | 0.775880348 | 0.906567398 | 0.775921794 | 1.0298048 | 0.7858 | 0.75227 | 0.2570352 |
| Tsc | 0.038464834 | 0.043546715 | 0.038506281 | 0.0360664 | 0.030048 | 0.03095 | 0.0182588 |

TABLE 2

Comparison of 10 HP, 60 Hz, 4 Pole Induction Motor Data

| MFG | MAR | MAR | A |
|---|---|---|---|
| Cat # | P336 | Y983 | |
| Frame | 256 | 254 | 256 |
| HP | 10 | 10 | |
| RPM | 1800 | 1800 | 1800 |
| R1 | 0.5396 | 0.432 | 0.014 |
| R2 | 0.4885 | 0.335 | 0.018 |
| X1 | 2.093 | 1.4995 | 0.054 |
| X2 | 3.209 | 1.741 | 0.040275 |
| Xm | 51.12 | 36.92 | 1.0233 |
| Toc | 0.590019031 | 0.612247687 | 0.313468923 |
| Tsc | 0.056686278 | 0.050390752 | 0.026988031 | the air gap size. Stator leakage reactance can be reduced by reducing the number of turns, reducing the machine volume and keeping the slot size small. It is further recognized that these reactances can be reduced on a transient basis by selective implementation of shorted conductors or shields in close proximity to the windings. The rotor and stator resistances can be decreased by decreasing the winding length (fewer turns, shorter machine length, smaller slot pitch etc.), increasing the conductor area (either larger conductors or smaller conductors in parallel) or changing the conductor material.

A comparison of the data in both tables reveals several notable differences. For example, the magnetizing reactance of the invention is approximately ¼ that of similar sized IMG's and approximately % that of IMG's with similar power rating. Also, the time constants of the invention are substantially lower than those of continuous duty motors of comparable size and power rating. Most importantly, Ts0, which provides an indication for the amount of time it takes to build up the magnetic fields in the IMG is approximately half the value for IMG's of comparable size and power rating. Lastly, it is clear from the maximum torque values that the overload capability of the invention is comparable to the larger motors.

It clear from equations 3 and 5 that increasing resistances $R_1$ and $R_2$ is also a means of reducing the time constants. However, increasing these values too much can result in poor machine efficiency and excess heating. Therefore, adjustments in $R_1$ and $R_2$ must be considered in light of the expected operating environment and chosen thermal management system. It is also clear from equations 3 through 5 that, lowering the magnetizing and leakage reactances enables the IMG to more quickly switch from a motoring mode to a generating mode. The reactances ($X_1$, $X_2$, $X_m$) can be scaled by frequency to obtain inductances ($L_1$, $L_2$, $L_m$) that provide an indicator of the energy stored within the magnetic fields of the IMG during operation. Inductance represents the ability of an electrical circuit to store energy in the form of a magnetic field. The presence of inductive energy storage in a circuit may cause a slowed or lagging buildup of current in response to an applied voltage. Increases in inductance generally lead to slower response (e.g., switch from a motor mode to a generator mode) and, therefore, it is preferable to minimize inductances in designs where quick response is needed to meet performance goals.

In addition to slower response times, increased inductance may require that more energy be supplied from an external source in order to build up magnetic fields needed to operate the IMG. The IMG of the present invention may be constructed to operate in connection with a DC bus that, in turn, provides power to a critical load via conversion circuitry during a discharge event. In the event that the primary power source is disconnected, the DC bus voltage will begin to fall as current flows through the conversion circuitry to the critical load. As discussed above, the IMG's of the present invention are designed to operate at reduced power levels during a motoring mode to limit power losses and operating temperatures. Operating at such low power levels may result in a relatively low magnetization current which may be too low to enable the IMG to generate full power output immediately upon transition from motor mode to generation mode. Therefore, energy must also be drawn from the DC bus to build the magnetic fields within the IMG upon entry into discharge. Thus, the DC bus capacitance must be sized appropriately to provide power to the critical load and provide the energy needed to build up the magnetic fields within the IMG while avoiding excessive voltage fluctuations during entry into discharge. The present invention is designed to limit capacitance requirements for the DC bus by minimizing the energy stored within magnetic fields and minimizing response time. This, in turn helps to reduce system cost and packaging requirements due to reduction in the physical number and size of capacitors on the DC bus.

Note that there may be critical voltage limits associated with the DC bus. These limits may include, for example, the voltage below which the critical load may cease to function properly and the voltage below which the IMG fails to produce sufficient power to supply the load and recharge the DC bus. Load voltage sensitivity is highly variable depending on the equipment that makes up the load. Typical values are in the range of 10%-40% below nominal. In the present embodiment, the minimum required voltage needed to generate full power on the current embodiment of this design is 360 Vrms, line to line. Below this voltage, the internal impedance (combined internal reactances and resistances) of the machine may limit the current flow within the IMG to the point where it can no longer perform at full capacity.

In addition to meeting a range of DC bus voltage requirements, the IMG is designed to meet performance requirements for a range of flywheel speeds. The flywheel speed range can be limited by several factors including energy storage requirements, material property limits, drag loss requirements, and packaging constraints. The operational speed range of the flywheel may be optimized based on these factors. Once the flywheel speed range is set, the IMG may be designed to operate at full power over that range and preferably a reasonable tolerance beyond that range. The DC bus voltage can vary widely depending on load requirements and utility voltage available at the installation site. In one embodiment, the IMG may be designed to operate with a DC bus having voltages ranging between 360 and 540 VDC. It is understood that the IMG can be designed to operate in connection with other voltage ranges, and need not be limited by the specific embodiment discussed herein.

Design limitations for the IMG when taking the flywheel speed range into account include (1) mechanical stresses on the rotor at maximum speed (2) lowest specified DC bus voltage at maximum speed and (3) highest DC bus voltage at minimum speed. The first limit may be used to determine the maximum diameter of the IMG in order to maintain acceptable stress levels in the rotor. The second limit may be used to tune the circuit parameters of the IMG such that the breakdown torque (or sometimes referred to as pushover torque) of the machine is some suitably small margin above that required to meet output power requirements. The breakdown torque is the point when an IMG is overloaded beyond the IMG's torque capability which causes the IMG to stall or abruptly slow down. The third limit may be used to tailor the size of the IMG such that the IMG reaches magnetic saturation as the peak current limits of the converter electronics are reached. In this embodiment, the flywheel may fail to produce adequate power to recharge the DC bus and critical load at a DC bus voltage less than 360 Vdc and a flywheel speed of 8000 RPM and may saturate or reach electronics current limits at a DC bus voltage of 480 Vdc and 3600 RPM. It is understood that the IMG can be designed to operate in connection with other voltage and flywheel speed ranges, and need not be limited by the specific embodiment discussed herein.

Figure 9:
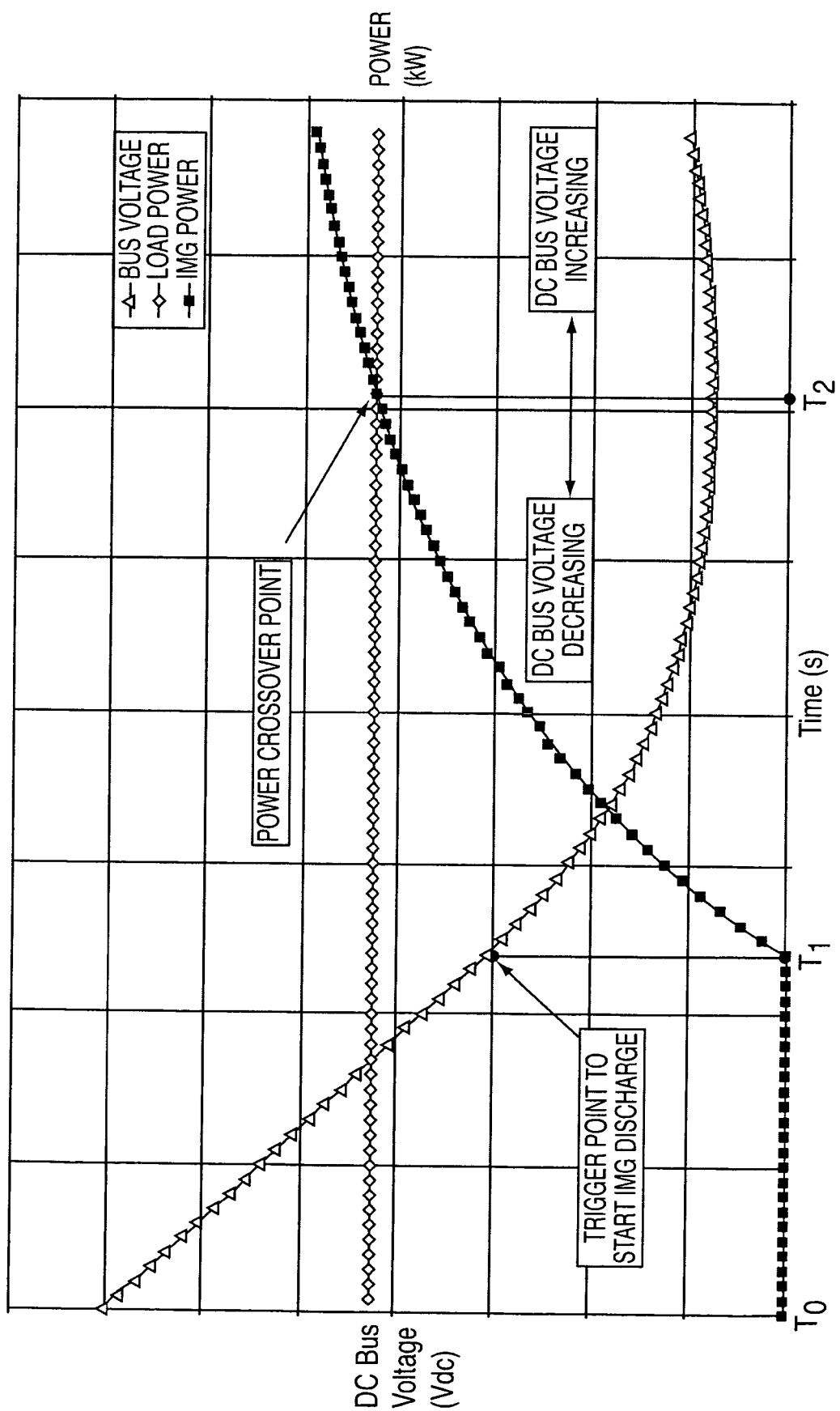
FIG. 9 is a graph showing DC bus voltage versus time, power supplied to the critical load versus time, and power generated by the flywheel energy storage system versus time during a discharge event in accordance with the principles of the present invention.

FIG. 9 is a graph showing DC bus voltage versus time, power supplied to the critical load versus time, and power generated by the IMG versus time during a discharge event in accordance with the principles of the present invention. As illustrated in FIG. 9, the DC bus initially supplies all of the power to the critical load from T0 to T1, which is the time period from the initial interruption in the supply of power from a primary power source to the critical load (T0) to a trigger point to start discharge of the IMG (T1). Between time periods T0 and T1, current supplied from the DC bus to the critical load causes the voltage on the DC bus to fall, as shown. The trigger point (shown here as T1) may occur when certain parameters are met. For example, initiation of discharge may occur when the DC bus voltage drops to or below a predetermined voltage level, when the rate of change in voltage of the DC bus exceeds a predetermined rate or when the flywheel speed drops below a given RPM threshold.

Figure 10:
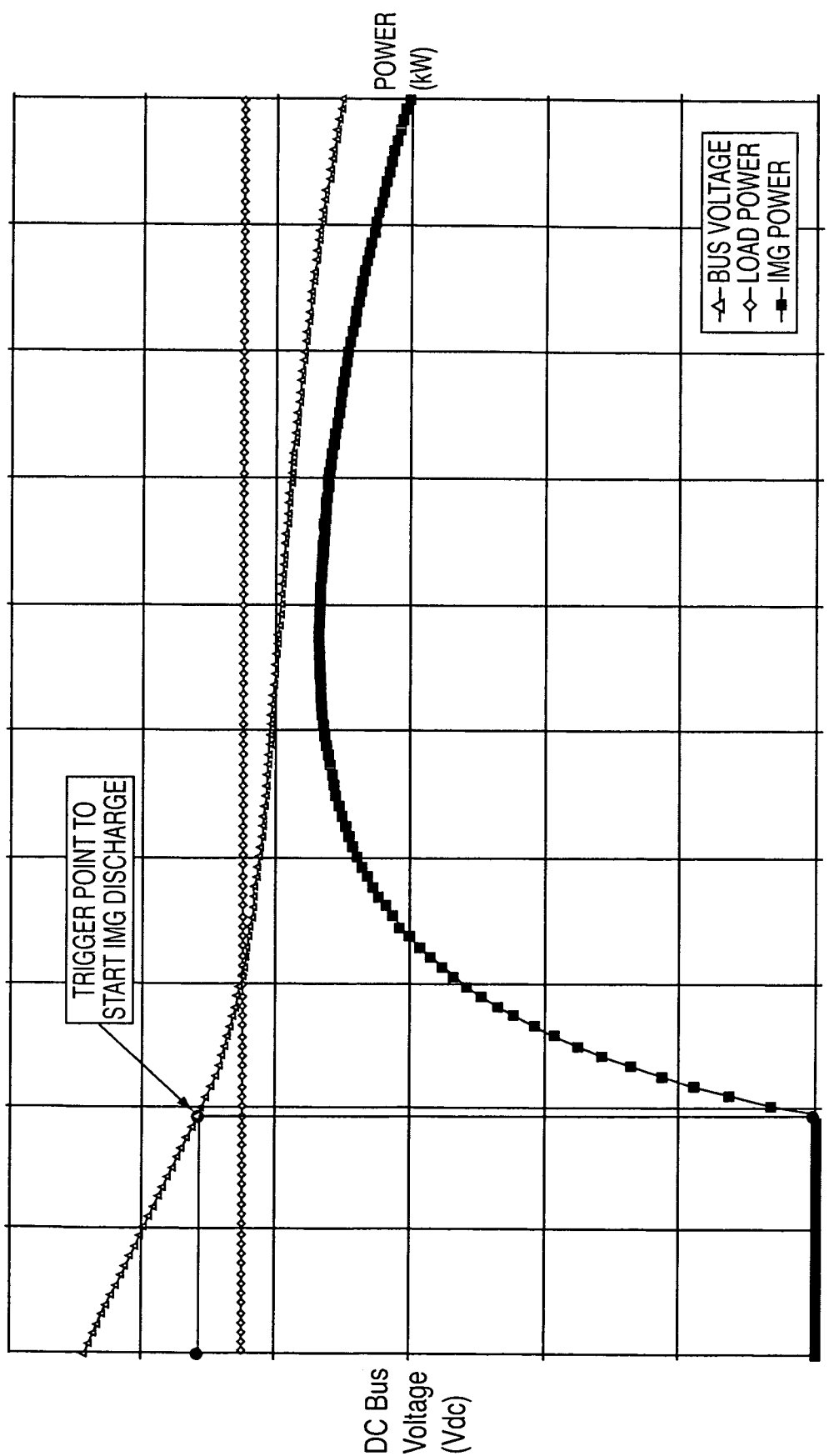
FIG. 10 is a graph showing an example of a failed load catch where the flywheel energy storage system fails to generate sufficient power within the necessary time period to power the load and replenish the DC bus.

Starting at time period T1, the IMG begins generating power which is supplied to the critical load. The generation of power may slow the rate of change in the decrease of DC bus voltage and begin charging the DC bus. Time period T2 represents a point in the discharge period where the IMG begins to charge the DC bus. Thus, from time period T2 onward (at least until all practical usable flywheel energy is consumed, or a current or thermal limit is reached), the IMG may generate enough power to supply the critical load and recharge the DC bus voltage. FIG. 9 illustrates a discharge event where the IMG successfully "catches" the load. In contrast, FIG. 10 illustrates an example of a failed load catch where the IMG fails to generate sufficient power within the necessary time period to power the load and replenish the DC bus. As a result, and as shown, the DC bus voltage may continue to decline and eventually decline to a point where the internal impedance of the IMG limits current flow below that needed to meet magnetizing current requirements and to support the load and DC bus. The flywheel system according to the present invention is constructed and operative to prevent such failures.

Figure 11:
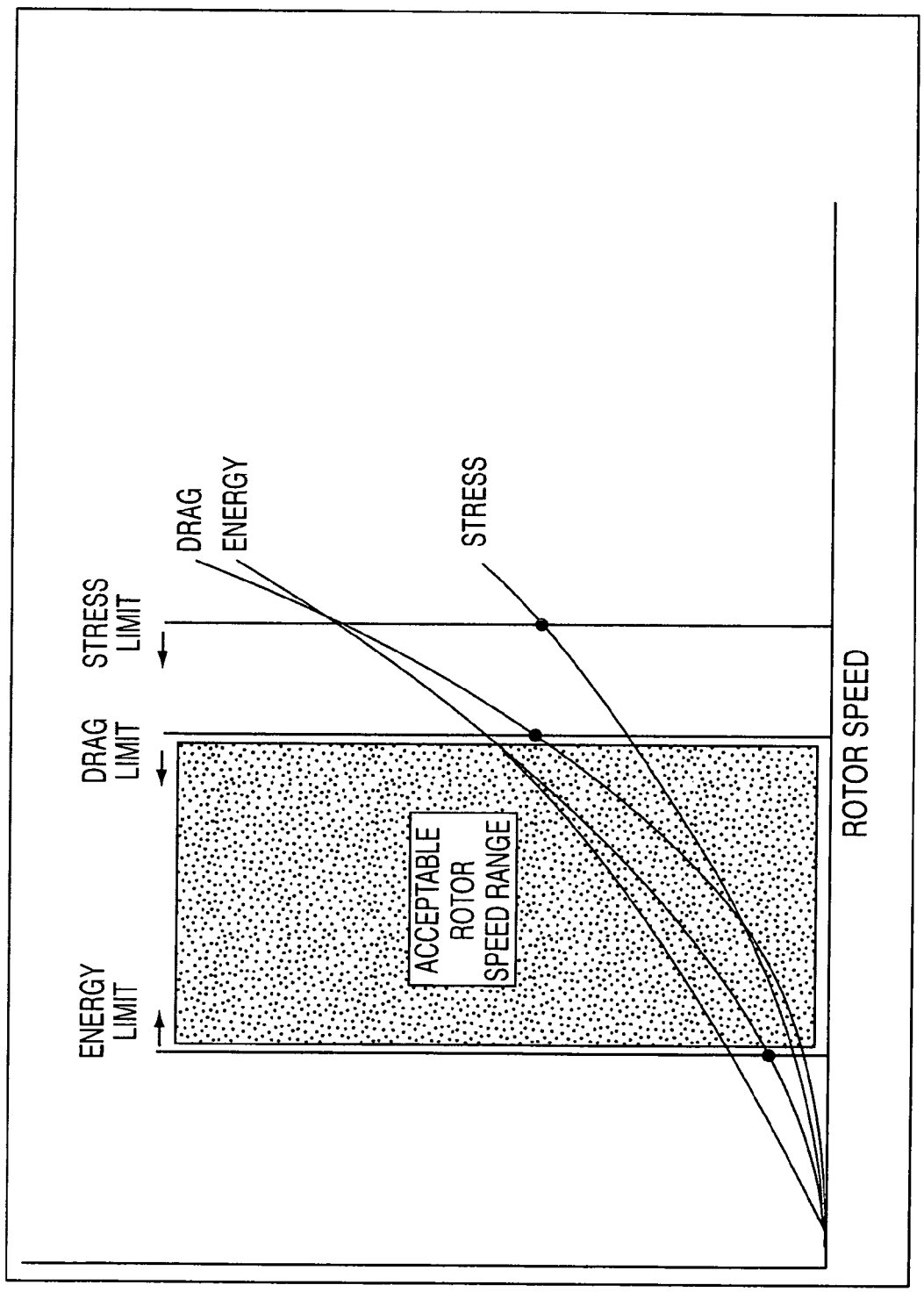
FIG. 11 shows a graph illustrating energy, stress, and drag as a function of flywheel speed, and further shows an energy limit, a drag limit, and a stress limit of a flywheel energy storage system designed according to the principles of the present invention.

In one aspect of the present invention, the flywheel of the flywheel system may be designed to balance the following factors: energy, stress, drag, weight, speed, where it is desirable to minimize stress, aerodynamic drag, and weight while maximizing stored energy. FIG. 11 shows a graph illustrating energy, stress, and drag a function of speed. FIG. 11 further shows an energy limit, a drag limit, and a stress limit of a flywheel designed according to the principles of the present invention. Stress is proportional to the square of tip speed (i.e., linear velocity of the flywheel periphery), and aerodynamic drag is a complicated function of the cube of tip speed and other geometric factors. Balancing the negative effects of high tip speed on stress and drag with the positive effects on stored energy per unit weight requires an optimization process in which many tradeoffs are necessary, especially considering that lower weight requires higher tip speed to achieve desired energy production. As shown in FIG. 11, the result of an optimization process according to the invention yields an acceptable rotor speed range that falls inside of the stress and drag limitations, but that exceeds the energy storage requirements of the flywheel system.

Figure 18:
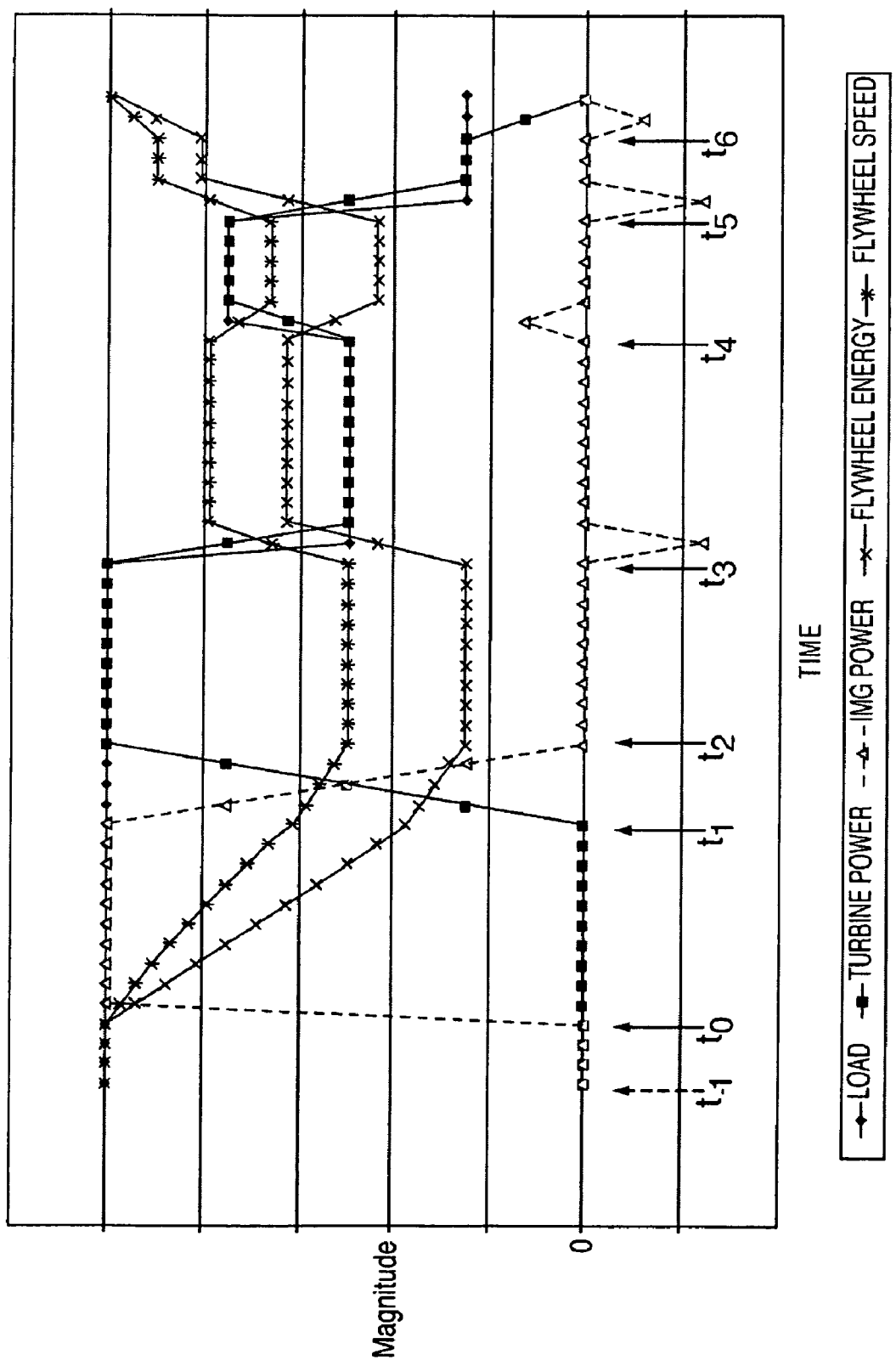
FIG. 18 shows a timing diagram of flywheel energy and speed, turbine power, IMG power, and load in accordance with the principles of the present invention.

The flywheel system may be used both as an energy source and an energy sink (e.g., to prevent a turbine overspeed condition). Generally, air turbines, such as turbine 130 of FIG. 1, may not be capable of substantially immediately responding to changing load conditions. Such changes in load demand may be referred to herein as sudden step changes in load demand. This may be due to delays associated with valve action but also the presence of gas (e.g., air) in the system having inappropriate thermodynamic states (e.g., pressure and temperature) for the new load requirements. Therefore, an IMG according to the invention may be used as a short-term energy source in the event of a step load or a short-term energy sink in the event of a step unload. An example of how the flywheel energy system may be used as both an energy source and an energy sink is now discussed in connection with FIG. 18, which shows a timing diagram of flywheel energy and speed, turbine power, IMG power, and load in accordance with the principles of the present invention.

Starting at time $t_{-1}$, when line power is providing power to the load, the energy level and the flywheel speed may be at a maximum or standby level and speed, respectively, and the turbine and IMG are not providing power because such power is not required. At time $t_0$, an interruption in line power occurs, at which point, the IMG provides power to the load. As shown, as the IMG continues to provide power, the flywheel energy and speed decrease. Up until time $t_1$ (time between $t_0$ and $t_1$), the IMG is the only source of backup power. At time $t_1$, the turbine is activated (e.g., the compressed gas system is activated to supply power to the load), and both the IMG and turbine are supplying power to the load. At time $t_2$, the turbine is the primary source of backup power provided to the load. That is, the IMG is no longer required to supply the substantial portion of the backup power to the load. Note that the flywheel speed is now at an intermediate speed. As will be explained, from time $t_2$ onward, the IMG operates to compensate for sudden changes in load demand.

At time $t_2$, even though the IMG may not be providing power, its flywheel continues to operate at an intermediate speed, thereby maintaining at least an intermediate energy level. At time $t_3$, a step unload event occurs. During a step unload event, the load demand may suddenly drop, thereby resulting in a situation where the turbine is temporarily supplying too much power (because the response time of the compressed energy system may not be able to instantaneously track changes in load demand). This excess power may be absorbed by or "sunk" into the IMG. When absorbing the power, the IMG may use it to speed up the rotational speed of the flywheel, as shown, resulting in a higher intermediate flywheel speed. The flywheel energy may also increase when absorbing power from the turbine.

At time $t_4$, a step load event occurs. During this event, the IMG may supplement power provided by the turbine until the compressed gas system adjusts to the new load demand. During load events, the flywheel speed may decrease to a lower intermediate speed, as shown. Note that although the energy level and flywheel speed of the IMG changes to various intermediate speeds, the IMG may remain operative to supply and absorb power for subsequent changes in load demand.

At time $t_5$, another step unload event occurs. Then, at time $t_6$, line power is restored, at which point the power provided by the turbine is no longer needed. The compressed gas system may shut down and the excess power may be absorbed by the IMG to bring, for example, the flywheel speed up to or near a standby speed.

When used as an energy source during a step load, the IMG temporarily provides power to the load from the energy stored in the flywheel. When used as an energy sink during a step unload, the IMG temporarily absorbs excess power generated by the turbine-powered generator as the turbine transitions to a lower power level. Use of the IMG as a sink and source advantageously eliminates a need to use another energy sink, such as a load resistor, to compensate for step unload events and an additional energy source, such as a battery, to compensate for a step load event. Sinking excess power to the IMG may prevent a turbine overspeed condition which could potentially damage the turbine.

It is understood that although the use of the IMG as a source and a sink is discussed as operating in connection with a compressed gas system, the IMG may be used with other systems capable of providing backup power.

Figure 12:
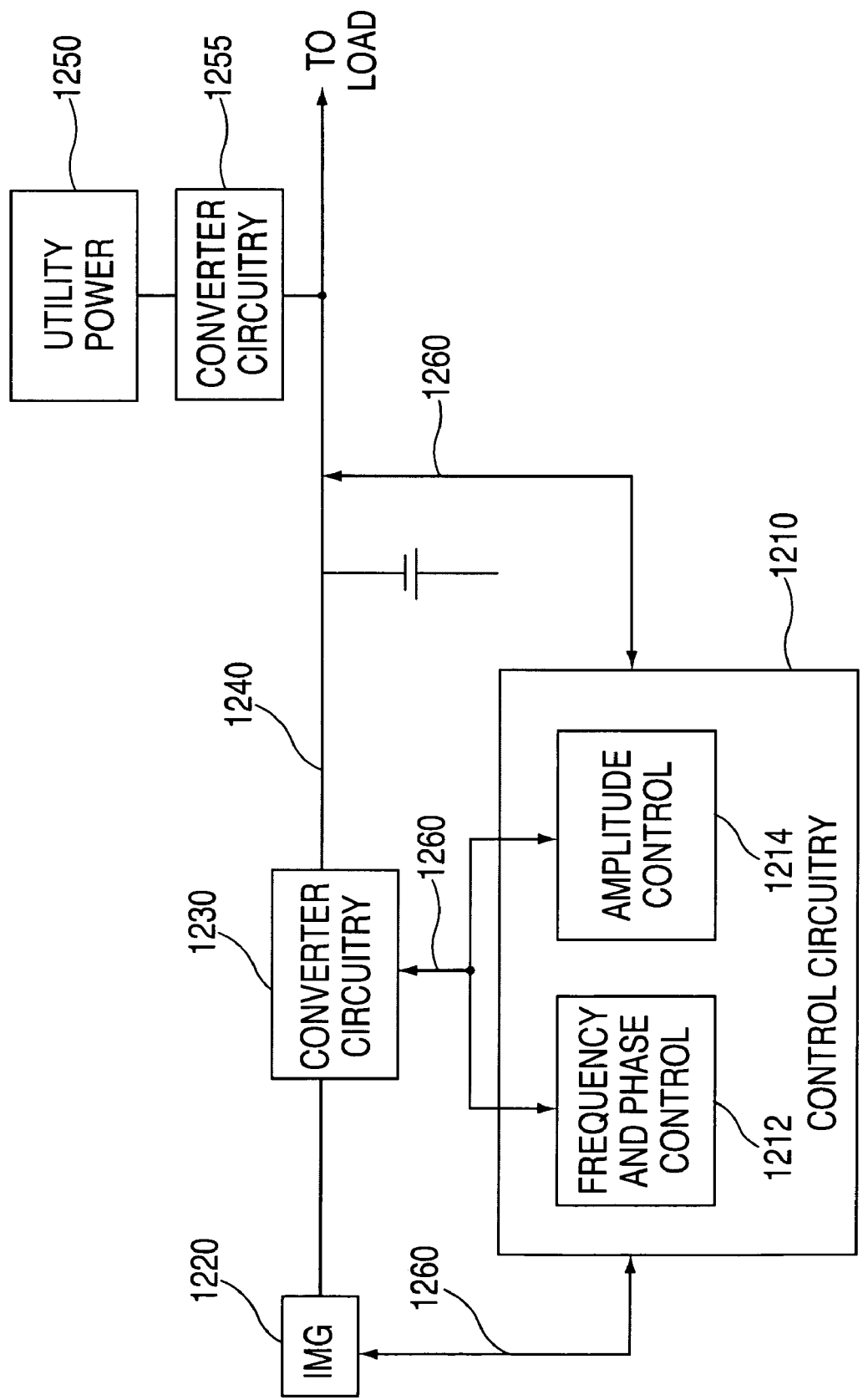
FIG. 12 shows an illustrative schematic for controlling the induction motor/generator portion of the flywheel energy storage system in accordance with the principles of the present invention.

FIG. 12 shows an illustrative block diagram of control circuitry 1210, IMG 1220, converter circuitry 1230, DC bus 1240, utility power 1250 in accordance with the principles of the present invention. As shown, IMG 1220 is electrically coupled to converter 1230, which is electrically coupled to DC bus 1240. DC bus 1240 may be electrically coupled to utility power 1250 via converter circuitry 1255 and to a load (not shown). Communications paths 1260 may be provided to allow control and data signals to be transmitted to, from, and between various components (e.g., control circuitry 1210, IMG 1220, converter circuitry 1230, and DC bus 1240). The data signals may include rotational speed, torque, temperature, and other data relating to IMG 1220 and the voltage of DC bus 1240. The control signals may be converter control signal (e.g., a PWM signal). Converter 1230 may provide data signals (e.g., voltage, current, and frequency) to control circuitry 1210.

Converter 1230 may be any suitable combination of circuitry capable of AC-to-DC conversion. For example, converter 1230 may include IGBTs, transistors, silicon controlled rectifiers, and/or diodes. Converter 1230 may be responsive to a converter control signal provided by control circuitry 1210 to provide an IMG control signal to IMG 1220.

Control circuitry 1210 may be operative to provide a control signal (e.g., a PWM control signal) to converter 1230 based on the data received from IMG 1220, converter 1230, the DC bus, or other data source. In general, control circuitry 1210 may directly control the operation of converter 1220 to control flow of real and reactive power to and from IMG 1220. The flow of real and reactive power to and from IMG 1220 may be determined by frequency and phase control 1212 and amplitude control 1214. Frequency and phase control 1212 may dictate how much real and reactive power is provided to and/or extracted from IMG 1220. For example, in a motor mode, both real and reactive power may be provided to IMG 1220. In a generation mode, reactive power may be provided to IMG 1220, whereas real power is extracted from IMG 1220. Amplitude control 1214 may dictate the quantity of real and reactive power provided to and/or extracted from IMG 1220. For example, during the motor mode, amplitude control 1214 may provide a signal that results in relatively low power consumption by IMG 1220. During the generation mode, amplitude control 1214 may provide a signal that results in a high power output by IMG 1220. The signal provided by amplitude control 1214 may be based on a number of factors, including but not limited to, a desired magnetization current and load demand.

An advantage of the present invention is that control circuitry 1210 may be operative to control the slip to regulate voltage on DC Bus 1240. Control circuitry 1210 may exercise such control by substantially instantaneously adjusting the frequency of the IMG control signal (e.g., excitation voltage) provided to IMG 1220 (e.g., the stator), where the transient response in any frequency change is substantially increased by using a proportional phase jump to instantaneously shift the phase of the IMG control signal. Such frequency control can be performed without a circuit model or calculation of any current or voltage transforms.

Figure 13:
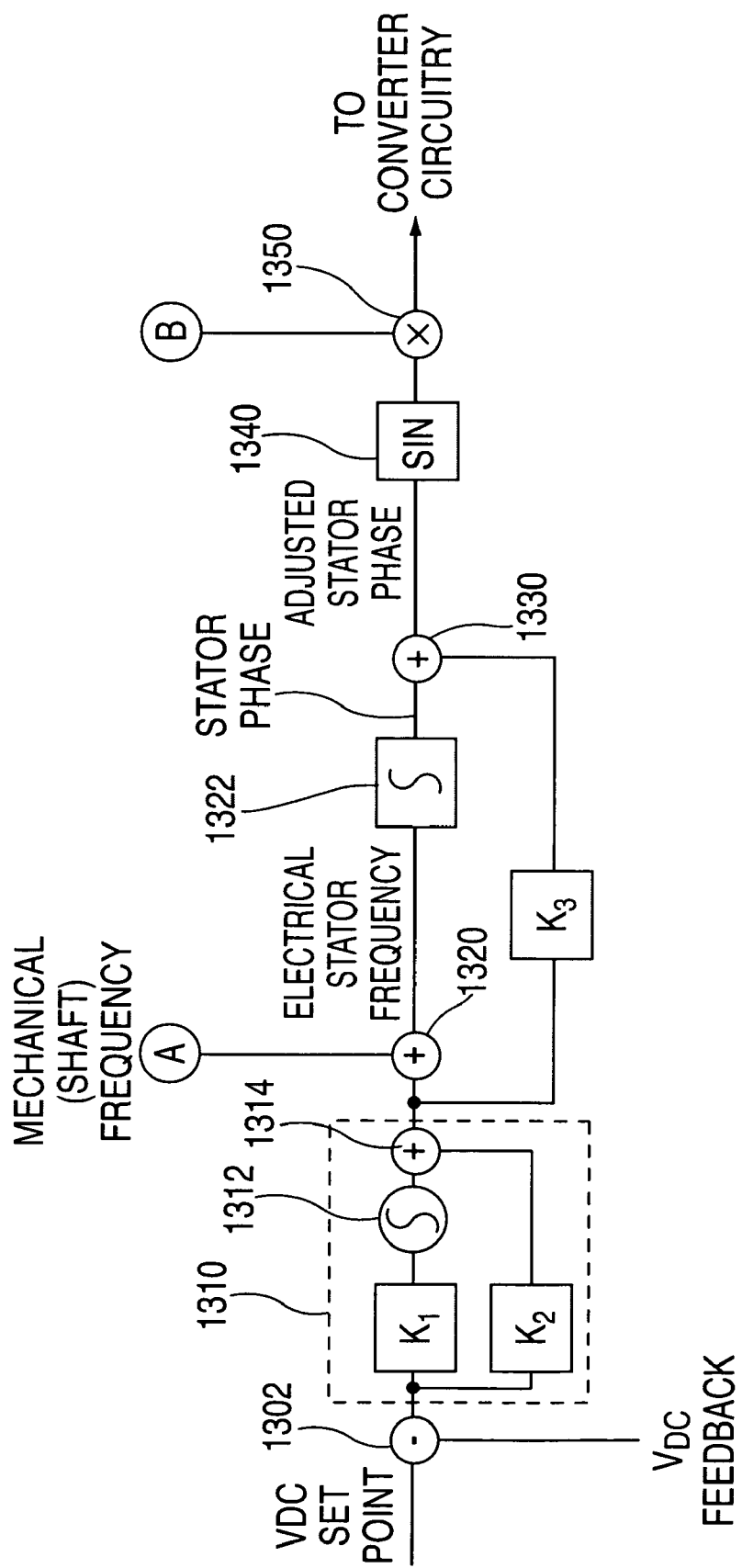
FIG. 13 shows an illustrative diagram of a control scheme in accordance with the principles of the present invention.

FIG. 13 shows an illustrative control scheme 1300 that may be implemented in accordance with an embodiment of the present invention for controlling slip of an IMG. Control scheme 1300 may be implemented, for example, in control circuitry 1200 of FIG. 12. Control scheme 1300 may receive several inputs, including a target bus voltage signal (labeled as "$V_{DC}$ Set Point"), a real-time or continuously measured value of the DC Bus (labeled as "$V_{DC}$ Feedback"), mechanical (rotor) frequency (labeled as A), and amplitude control signal (labeled as B) (provided, for example, by amplitude control 1214). The mechanical frequency of the rotor may be obtained, for example, by using a tachometer.

$V_{DC}$ Set Point may be provided by control circuitry and in one embodiment, the control circuitry may vary the set point depending on the operational mode of the IMG. For example, in a standby motoring mode, $V_{DC}$ Set Point may be set to a lower voltage than when the IMG is operating in a power generating mode. In another embodiment, the $V_{DC}$ Set Point may be permanently fixed to a predetermined voltage level.

Operation of the control scheme 1300 is now discussed. At differentiator 1302 (or sometimes referred to as a comparator), a difference between "$V_{DC}$ Set Point" and "$V_{DC}$ Feedback" is obtained and provided to a proportional integral (PI) controller 1310, which generates a slip demand, which is provided as the PI controller output. Slip demand refers to the slip that needs to exist between the machine rotor frequency and the electrical frequency to ensure the desired DC bus voltage is maintained. PI controllers are known in art and need not be discussed in great detail. As shown, PI controller 1310 is a simplified version of a controller including gain constants K1 and K2 (where the constants may have the same or different values), integrator 1312, and adder 1314.

When "$V_{DC}$ Feedback" is less than "$V_{DC}$ Set Point," a negative slip demand may be generated by PI controller 1310. A negative slip demand may be generated when the IMG is in the generating mode or needs to transition from a motoring mode to a generating mode. For example, "$V_{DC}$ Feedback" may drop below "$V_{DC}$ Set Point" when primary power fails and the load draws power from the DC Bus. When power is drawn from the DC Bus, the voltage may decrease. This decrease in voltage causes PI controller 1310 to generate a negative slip, which may causes the IMG to supply real power to the load while simultaneously charging the DC Bus.

When "$V_{DC}$ Feedback" is greater than or equal to "$V_{DC}$ Set Point," a positive slip demand may be generated by PI controller 1310. A positive slip may be generated when the IMG is in a motoring mode or needs to transition from a generating mode to a motor mode.

The slip demand is added to mechanical frequency/speed at adder 1320 to provide an electrical stator frequency. For example, by rearranging equation 1 above, it is understood that adding slip speed to mechanical speed yields a stator electrical frequency. This stator electrical frequency is integrated by integrator 1322 to produce a phase angle sweep at the stator frequency. This integrated term may be provided to adder 1330.

The slip demand, provided by PI controller 1310 may be scaled by a gain, K3, to produce a phase angle jump proportional to the slip demand (or a scaled slip demand). The phase angle jump (or scaled slip demand), when added to integrated frequency at adder 1330, substantially improves the transient response time of control scheme 1300. This is because the phase angle jump can cause the phase angle of the integrated frequency to "jump" into the new phase demanded of the slip prior to the end of a switching cycle. Thus inclusion of gain K3 adds a parallel control signal to control scheme 1300 that enables this embodiment of the present invention to more quickly adjust the phase angle of the integrated frequency than prior art control schemes.

The integrated frequency having the adjusted phase angle may be converted into a sinusoidal signal at sine function generator 1340. This sinusoidal signal (which may be the signal provided by frequency and phase control 1212 of FIG. 12) may be used to control the flow of real and reactive power into and/or out of an IMG. Optionally, an amplitude control signal (which may be the signal provided by amplitude control 1214 of FIG. 12) may be mixed (e.g., multiplied) at mixer 1350 to produce a converter control signal (e.g., a PWM duty signal).

Figure 14A:
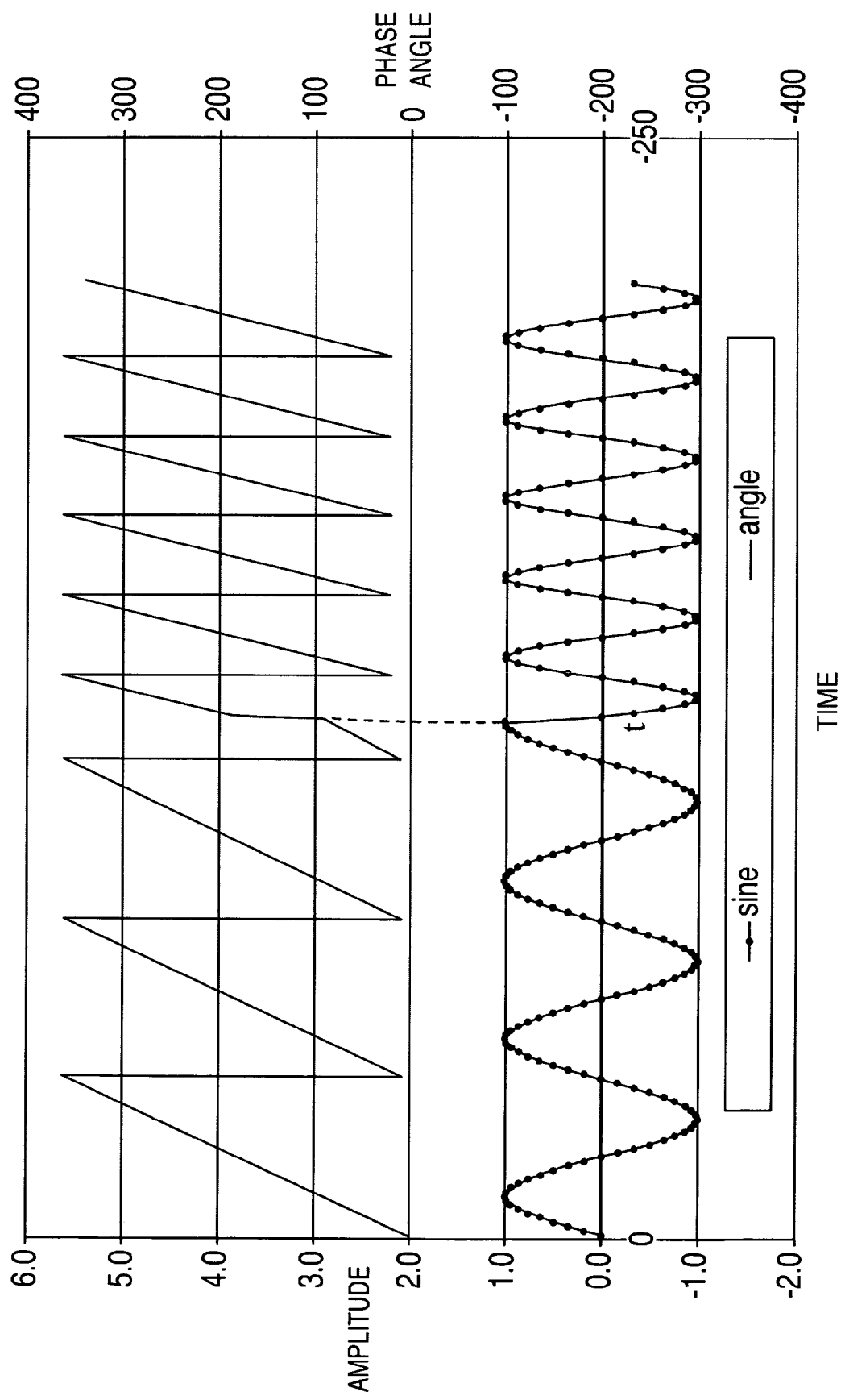
FIGS. 14A-C show several timing diagrams illustrating the operation of a control scheme in accordance with the principles of the present invention.
Figure 14B:
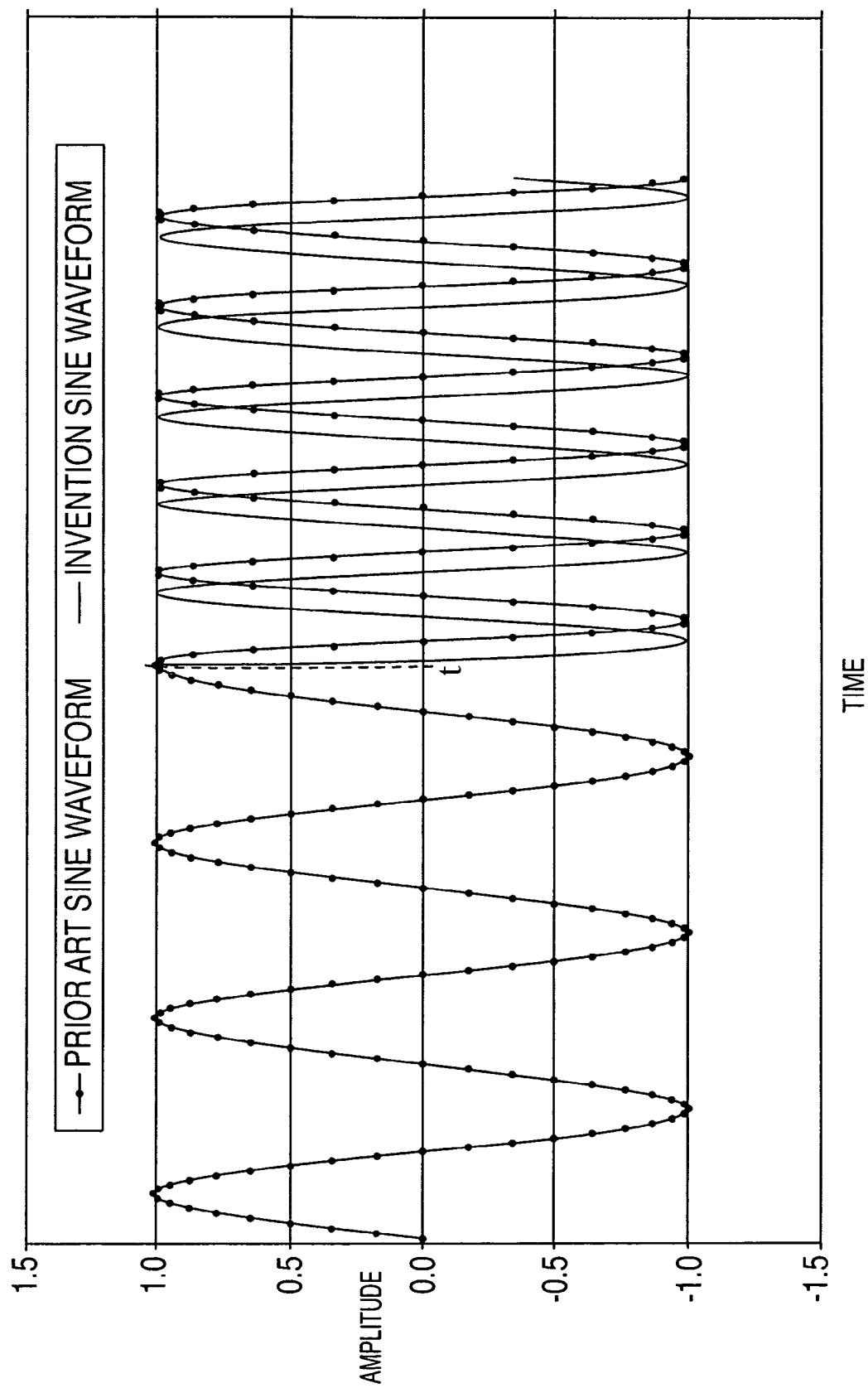
Figure 14C:
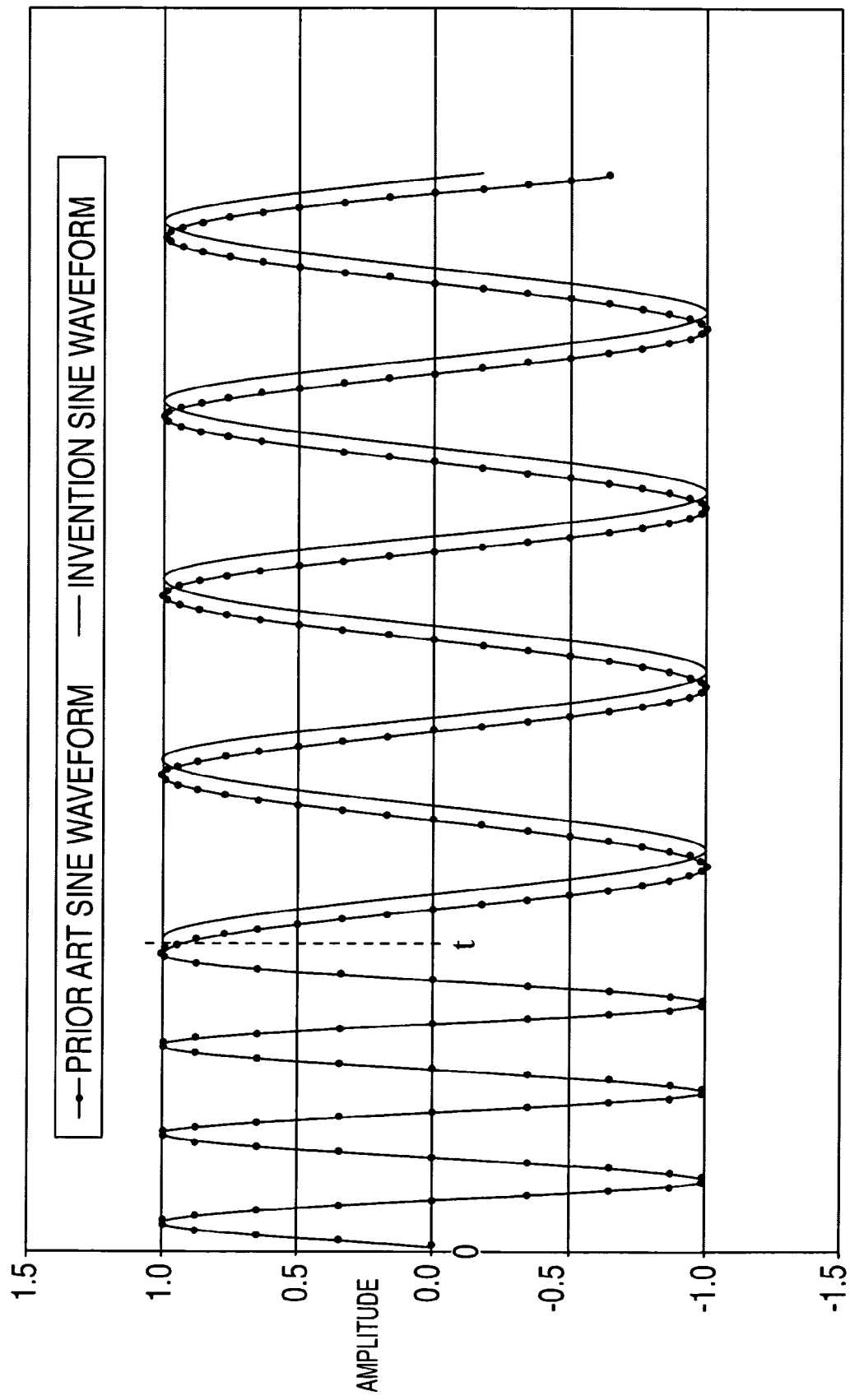

FIGS. 14A-C show several timing diagrams illustrating the operation of an IMG control scheme in accordance with the principles of the present invention. FIG. 14A shows the phase angle of stator frequency and a sine wave representative of the phase angle. Prior to time, t, the slope of the phase angle is relatively constant. Assume, for purposes of discussion, that the IMG is operating in a generation mode. As such, the stator frequency is less than the rotor rotational frequency. At time t, a change in "$V_{DC}$ Feedback" occurs (e.g., a step unload event occurs) which causes IMG control scheme to change the phase angle (as evidenced by increase in slope of the phase angle), signifying an increase in stator frequency. In this example, assume "$V_{DC}$ Feedback" increased in voltage, meaning that the load demand on the IMG decreased. As a result of the increase in "$V_{DC}$ Feedback," the slip demand increases, which causes the stator frequency to increase (relative to rotor mechanical frequency), thereby reducing the power generated by the IMG. The responsiveness of the control scheme is shown by the rapid change in the slope of the phase angle.

Figure 15:
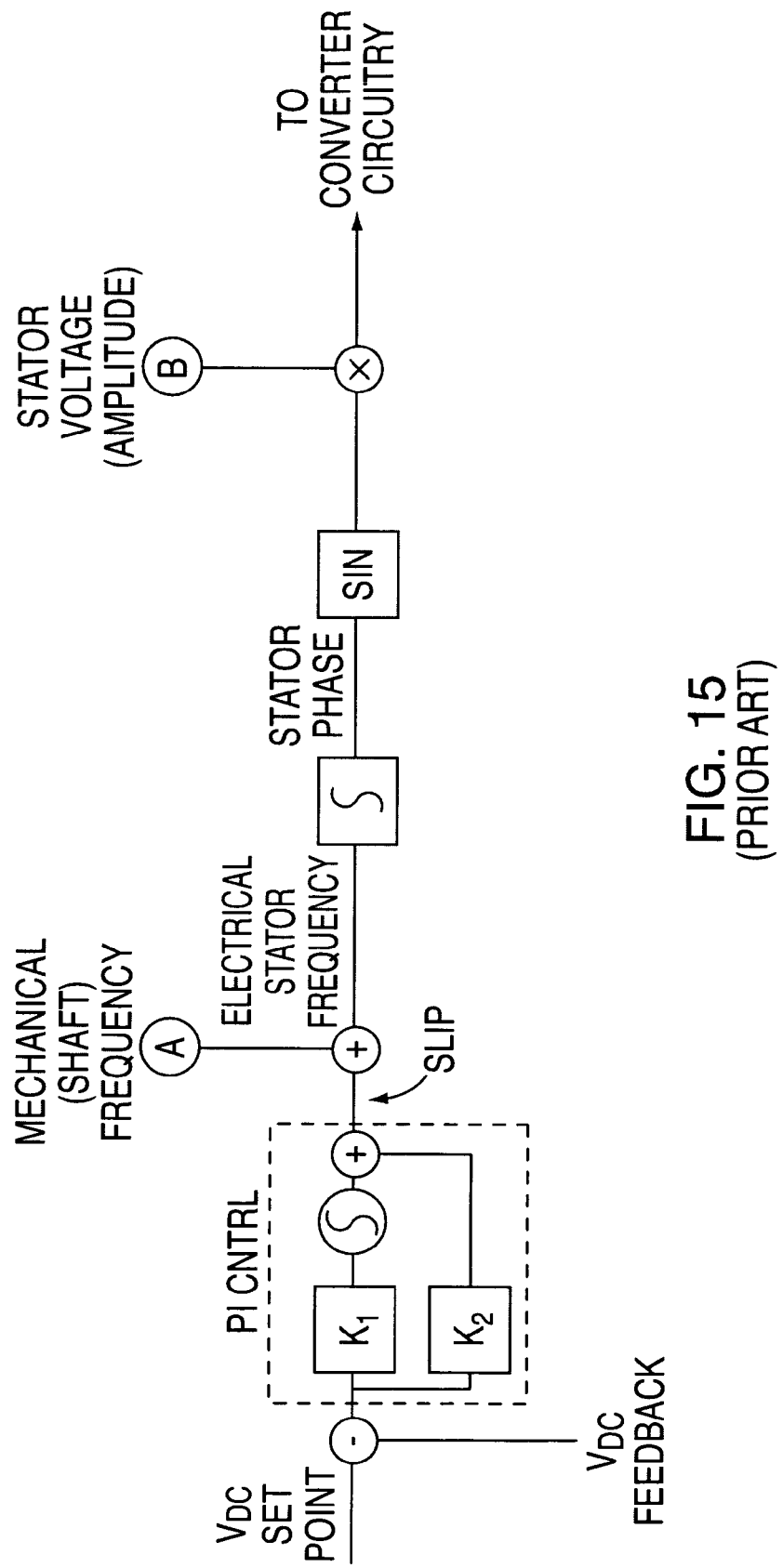
FIG. 15 shows an illustrative diagram of a prior art control scheme.

FIG. 14B compares a sine waveform generated by an IMG control scheme according to the invention to a sine waveform generated by a prior art IMG control scheme when the stator frequency increases. FIG. 15 shows a prior art control scheme from which the sine waveform is generated. As shown, prior to time t, both the prior art sine waveform and the sine waveform according to the invention are the same. At time t, where a frequency change occurs, it is seen that the sine waveform according to the invention changes to a desired phase angle faster than the prior art waveform. FIG. 14C compares a sine waveform generated by an IMG control scheme according to the invention to a sine waveform generated by a prior art IMG control scheme when the stator frequency decreases. At time t, it is also seen that the sine waveform according to the invention changes to a desired phase angle faster than the prior art waveform.

Since the response time of IMG control scheme is substantially faster than the prior art, several advantages are realized, including use of smaller capacitors, enhanced load catching ability, and lower costs.

Figure 16:
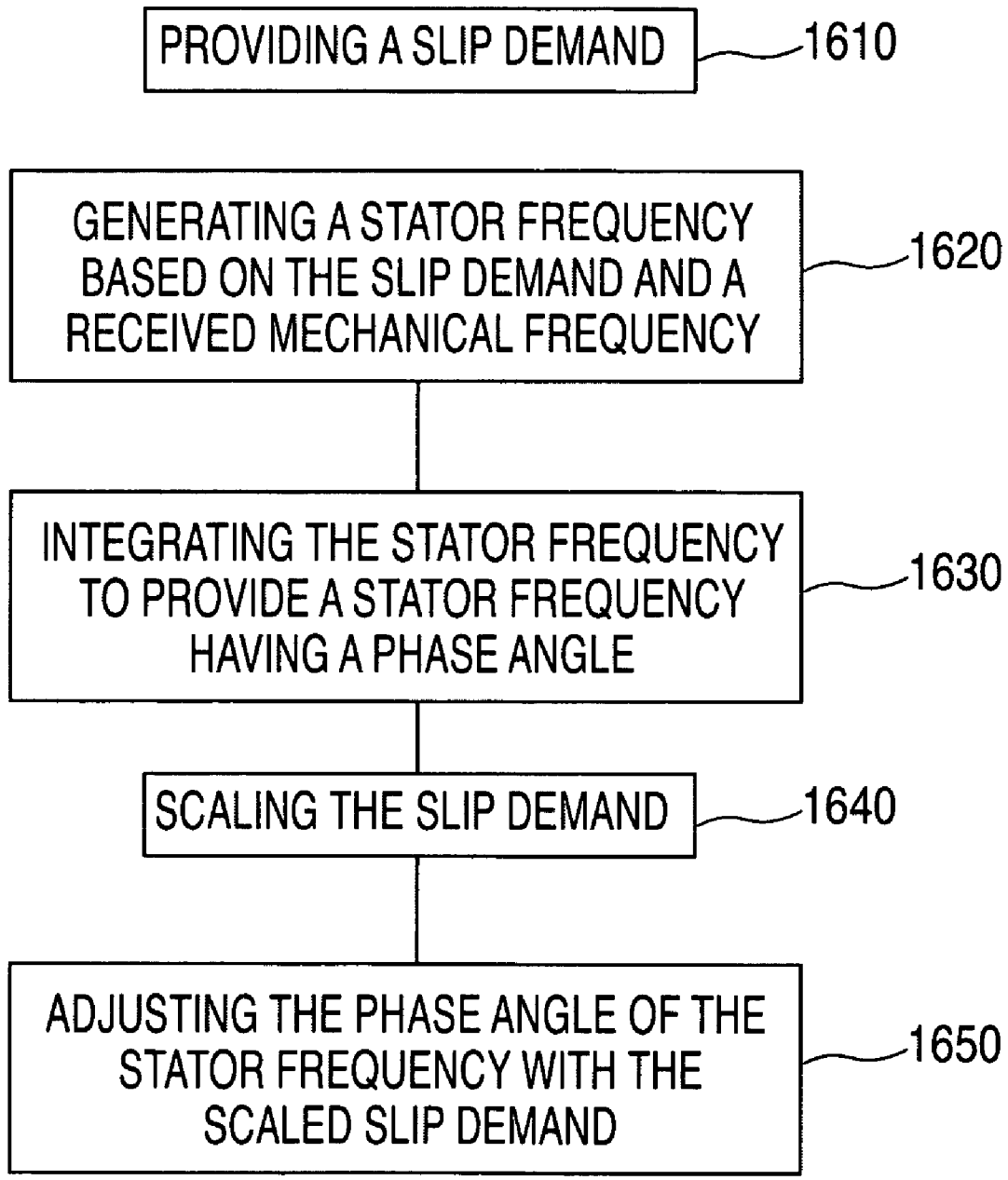
FIG. 16 is a flowchart of steps that may be taken by a control scheme in accordance with the principles of the present invention.

FIG. 16 is a flowchart showing steps that may be taken to control an IMG in accordance with the principles of the present invention. At step 1610, a slip demand may be provided. As discussed above, the slip demand may be generated based on a net difference between a measured DC bus voltage level (e.g., "$V_{DC}$ Feedback") and a desired DC bus voltage level (e.g., "$V_{DC}$ Set Point"). At step 1620, a stator frequency is generated based on the slip demand and a received mechanical frequency. The stator frequency may be the frequency required to restore the DC bus back to the desired DC bus voltage level. At step 1630, the stator frequency may be integrated to provide a phase angle sweep at the given frequency. At step 1640, the slip demand may be scaled to provide a scaled slip demand. The scaled slip demand provides an additional control parameter (which is generated in parallel to the integrated stator frequency) that enhances the response time of the IMG control scheme according to the invention, as shown in step 1650. That is, the scaled slip demand may be used to adjust the phase angle of the stator frequency so that the desired phase angle is rapidly obtained.

FIGS. 13, 14, and 16 may be used in connection with any IMG, not just the transient IMG according to embodiments of the present invention. For example, the control scheme may be used in connection with continuous IMGs.

In one aspect of the present invention, a method is provided for reducing the number of unnecessary turbine starts. The flywheel in the flywheel system according to the invention may be sized and rotated at sufficient speed such that it stores enough energy for the system to deliver full power to a load for a slightly longer time than the time needed to bring the turbine (e.g., turbine 130 of FIG. 1) to speed. The extra stored energy (i.e., the stored energy in excess of that needed to deliver full power for the time needed to bring the turbine to full power) may enable the flywheel system to support certain disturbances in the supply of primary power without requiring turbine startup. This helps preserve the life of a variety of moving parts associated with the turbine (e.g., valves, regulators, turbine bearings, etc.).

Conventionally, turbine operation is initiated after a fixed time delay. If the power disturbance is ongoing after the fixed time delay, the turbine is initiated to supply power to the critical load. However, in many instances, this conventional method may result in unnecessary turbine start events. For example, consider a situation where load consumption is less than the rated power output of the flywheel system and the primary power source is disturbed for a period of time which may be ridden, through by the flywheel system, but the turbine is activated nonetheless because the fixed time delay is exceeded. In accordance with the present invention, the turbine (e.g., turbine 130 of FIG. 1) may be started when the flywheel of flywheel system slows down to a predetermined rotational velocity (RPM). This approach ensures that the turbine is started only when absolutely necessary. That is, the turbine is activated when the predetermined rotational velocity is reached such that it is able to get up to speed in time to provide power to the critical load before the energy stored in the flywheel energy system is depleted. Thus, this approach activates the turbine based on an energy level of the flywheel system, as opposed to a fixed time.

The above described embodiments of the present invention are presented for purposes of illustration and not of limitation, and the present invention is limited only by the claims which follow.

What is claimed is:

1. An uninterruptible power supply system comprising:
   a long-term backup power system; and
   a flywheel energy storage system comprising:
      a flywheel coupled to a shaft for rotation about a substantially vertical axis;
      a support assembly for supporting a rotor assembly, the support assembly comprising:
         thrust and non-thrust bearings for providing radial and axial support of the rotor assembly;
         a spring for applying an upward preload force to the non-thrust bearing to counteract a predetermined portion of a load applied to the thrust bearing by the rotor assembly;
         a cartridge having a cavity constructed to house the spring and non-thrust bearing therein; and
         a retainer coupled to the cartridge for securing the non-thrust bearing and spring within the cavity.

2. The system of claim 1, wherein the cartridge comprises at least one channel for supporting a membrane, the system comprising a membrane in each channel, each membrane interacting with the outer diameter of the bearing outer race.

3. The system of claim 2, wherein each membrane is an o-ring.

4. An uninterruptible power supply system comprising:
   a long-term backup power system; and
   a flywheel energy storage system comprising:
      a flywheel coupled to a shaft for rotation about a substantially vertical axis;
      a support assembly for supporting a rotor assembly, the support assembly comprising:
         thrust and non-thrust bearings for providing radial and axial support of the rotor assembly;
         a spring for applying an upward preload force to the non-thrust bearing to counteract a predetermined portion of a load applied to the thrust bearing by the rotor assembly;
         a washer;
         a cartridge having a cavity, the cavity constructed to house the spring, washer, and bearing therein, wherein the washer is coupled between the spring and bearing, and the spring is seated in a bottom portion of the cavity; and a retainer coupled to the cartridge for securing the bearing, washer, and spring within the cavity.

5. The system of claim 4, wherein the bearing has inner and outer races, and wherein the washer interacts with the outer race, but not the inner race.

6. An uninterruptible power supply system comprising:
a long-term backup power system; and
a flywheel energy storage system comprising:
    a flywheel coupled to a shaft for rotation about a substantially vertical axis;
    a support assembly for supporting a rotor assembly, the support assembly comprising:
        thrust and non-thrust bearings for providing radial and axial support of the rotor assembly; and
        a spring for applying an upward preload force to the non-thrust bearing to counteract a predetermined portion of a load applied to the thrust bearing by the rotor assembly,
wherein the predetermined portion of applied load is about half of the weight of the rotor assembly.

7. An uninterruptible power supply system comprising:
a long-term backup power system; and
a flywheel energy storage system comprising:
    a flywheel coupled to a shaft for rotation about a substantially vertical axis;
    a support assembly for supporting a rotor assembly, the support assembly comprising:
        thrust and non-thrust bearings for providing radial and axial support of the rotor assembly; and
        a spring for applying an upward preload force to the non-thrust bearing to counteract a predetermined portion of a load applied to the thrust bearing by the rotor assembly,
wherein the load applied to the thrust bearing is about the same as the load applied to the non-thrust bearing.

8. An uninterruptible power supply system comprising:
a long-term backup power system; and
a flywheel energy storage system comprising:
    a flywheel coupled to a shaft for rotation about a substantially vertical axis;
    a support assembly for supporting a rotor assembly, the support assembly comprising:
        thrust and non-thrust bearings for providing radial and axial support of the rotor assembly; and
        a spring for applying an upward preload force to the non-thrust bearing to counteract a predetermined portion of a load applied to the thrust bearing by the rotor assembly,
wherein the predetermined portion of applied load is at least a portion of the weight of the rotor assembly.

9. An uninterruptible power supply system, comprising:
a long-term backup power system;
an integrated induction motor generator flywheel energy storage system comprising:
    a flywheel coupled to a shaft for rotation about a substantially vertical axis;
    a vertically arranged rotor assembly having a predetermined weight, a top portion, and a bottom portion;
    a first support assembly for supporting the top portion; and
    a second support assembly for supporting the bottom portion, the second support assembly comprising:
        a bearing;
        a spring for applying an upward preload force to the bearing to counteract a predetermined portion of the predetermined weight of the rotor assembly;
        a cartridge having a cavity, the cavity constructed to house the spring and bearing therein; and
        a retainer coupled to the cartridge for securing the bearing and spring within the cavity,
the long-term backup power system cooperating with the integrated induction motor generator flywheel energy storage system to provide uninterruptible power.

10. An uninterruptible power supply system, comprising:
a long-term backup power system;
an integrated induction motor generator flywheel energy storage system comprising:
    a flywheel coupled to a shaft for rotation about a substantially vertical axis;
    a vertically arranged rotor assembly having a predetermined weight, a top portion, and a bottom portion;
    a first support assembly for supporting the top portion; and
    a second support assembly for supporting the bottom portion, the second support assembly comprising:
        a bearing;
        a spring for applying an upward preload force to the bearing to counteract a predetermined portion of the predetermined weight of the rotor assembly;
        a washer;
        a cartridge having a cavity, the cavity constructed to house the spring, washer, and bearing therein, wherein the washer is coupled between the spring and bearing, and the spring is seated in a bottom portion of the cavity; and
        a retainer coupled to the cartridge for securing the bearing, washer, and spring within the cavity,
the long-term backup power system cooperating with the integrated induction motor generator flywheel energy storage system to provide uninterruptible power.

* * * * *